US009099646B2

United States Patent
(12) United States Patent
Inokuma et al.
(10) Patent No.: US 9,099,646 B2
(45) Date of Patent: Aug. 4, 2015

(54) MANUFACTURING METHOD OF NON-VOLATILE STORAGE DEVICE, AND NON-VOLATILE STORAGE DEVICE

(71) Applicant: Kabushiki Kaisha Toshiba, Tokyo (JP)

(72) Inventors: Hideki Inokuma, Kanagawa (JP); Kazuhiko Yamamoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 13/778,971

(22) Filed: Feb. 27, 2013

(65) Prior Publication Data

US 2014/0042383 A1 Feb. 13, 2014

(30) Foreign Application Priority Data

Aug. 10, 2012 (JP) ............................... P2012-178331

(51) Int. Cl.
*H01L 21/20* (2006.01)
*H01L 45/00* (2006.01)
*H01L 27/24* (2006.01)

(52) U.S. Cl.
CPC ........ *H01L 45/1608* (2013.01); *H01L 27/2436* (2013.01); *H01L 27/2481* (2013.01); *H01L 45/04* (2013.01); *H01L 45/085* (2013.01); *H01L 45/1226* (2013.01); *H01L 45/146* (2013.01); *H01L 45/147* (2013.01); *H01L 45/1616* (2013.01); *H01L 45/1675* (2013.01)

(58) Field of Classification Search
None
See application file for complete search history.

(56) References Cited

U.S. PATENT DOCUMENTS

2008/0175032 A1 7/2008 Tanaka et al.
2011/0140068 A1 6/2011 Ozawa et al.

FOREIGN PATENT DOCUMENTS

JP 2010-199348 9/2010

*Primary Examiner* — Marvin Payen
(74) *Attorney, Agent, or Firm* — Patterson & Sheridan, LLP

(57) ABSTRACT

A manufacturing method includes forming a laminated body on a substrate. A mask layer is formed on the laminated body, and then a portion of the mask layer is removed to form an opening. Then, using the mask layer as a template, a first portion of the laminated body is removed to expose a portion of the substrate beneath the laminated body. The substrate is processed to alter the ratio between the size of mask opening and the removed first portion. A variable resistance layer is then deposited on exposed portions of the mask layer, the laminated body, and the substrate. Then the variable resistance layer is processed to remove at least a portion covering the substrate to permit contact with the underlying substrate. A second electrode layer is deposited to fill the removed portions of the laminated body.

12 Claims, 21 Drawing Sheets

MANUFACTURING METHOD OF NON-VOLATILE STORAGE DEVICE, AND NON-VOLATILE STORAGE DEVICE

CROSS-REFERENCE TO RELATED APPLICATION

This application is based upon and claims the benefit of priority from Japanese Patent Application No. 2012-178331, filed Aug. 10, 2012, the entire contents of which are incorporated herein by reference.

FIELD

Embodiments described herein relate generally to a method of manufacturing a non-volatile storage device and a non-volatile storage device.

BACKGROUND

In recent years, the development of new non-volatile storage devices such as resistance variable type memory (e.g., "ReRAM" (Resistance Random Access Memory)), conductive bridging type memory (e.g., "CBRAM" (Conductive Bridging Random Access Memory)) and the like have become a significant area of research and development. The resistance variable type memory and the conductive bridging type memory utilize a difference in a resistance value between a first state (a "low resistance state") and a second state (a "high resistance state") in a layer (a "variable resistance layer") which has variable resistance characteristics according to an applied voltage level. The variable resistance layer has generally good insulation characteristics, but at some applied voltage level, the layer forms conductive channels ("filaments") that reduce resistance (i.e., improve conductance) of the layer. The variable resistance layer can also be returned to the original insulating state (high resistance state).

For the resistance variable type memory and the conductive bridging type memory, a cross-point type memory cell array structure is typically adopted as it is viewed as easier to achieve high levels of integration, i.e., a high density of memory cells or elements, using such a structure.

However, when a cross-point type memory cell array structure is used, it will be necessary to carry out a photolithography process and an etching process for each layer of the structure, and thus the manufacturing cost will increase with the number of layers in the cell array. Therefore, a layered-type memory cell array structure that has memory cells of the vertical gate type or memory cells of the vertical channel type have been proposed.

When a layered-type memory cell array structure is used, the layered memory cell array can be formed in batch processing, by first forming the multiple electrode and insulating layers that will constitute the memory cell array, and then etching through the layers to isolate individual memory cells therefrom. This will reduce manufacturing costs of the memory cell array so long as the film layers may be pattern etched into individual cells without creating defects or shorts in the resulting stack.

However, when a layered-type memory cell array structure is formed by pattern etching, typically using a reactive ion etch, the sidewalls of the etched trenches or vias are typically tapered, where the uppermost portion of the trench or via is larger than the lowermost portion of the trench or via. Sidewall tapering can be the result of imperfect masking (edges of a masking feature may degrade during etching) or imperfect anisotropy of the etch process. In the manufacture of the memory cell, after etching of the trenches or vias to isolate individual stacks or pillars of memory cells, a variable resistance layer is deposited over the sidewalls of the stack, and, over the base of the trench or via. Thereafter, the portion of the variable resistance layer on the base of the trench or via must be removed, to avoid shorting between adjacent cells, again using a reactive ion etch process. But, because the sidewalls of the trench or via are tapered and are wider at the top of the feature as compared to the base of the feature, the portion of the variable resistance layer on the lower part of the feature, i.e., closer to the base, is etched away faster than that at the top, resulting in a thinner, or even no, variable resistance layer at the bottom of the feature, and a thicker layer at the top of the structure. If some portions of the variable resistance layer formed at the lower portion of the layered body are removed, the thickness of the variable resistance layer at the upper portion and the lower portion of the layered body will be different, and there is a danger of variation occurring in the memory characteristics of the resultant memory cells.

DESCRIPTION OF THE DRAWINGS

FIG. 10A to FIG. 100 are schematic cross-sectional views illustrating a formation of the variable resistance layer using a protective layer.

DETAILED DESCRIPTION

Figure 1A:
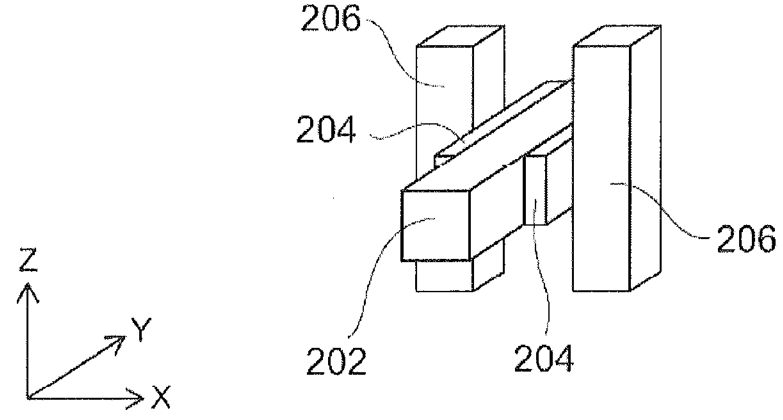
FIG. 1A is a schematic view illustrating vertical gate type memory cells.

In general, the embodiments will be described below with reference to the figures. In addition, in each of the figures, for the components that are similar, the same symbols will be used and repeated descriptions will be omitted as appropriate.

In addition, in the following, although a case which has a variable resistance memory is illustrated as an example, the teachings hereof may be used with a memory cell array structure of a layered type as in the case which has a conductive bridging type memory and the like.

Also, in the Figures, an X direction corresponds to an example of a second direction; a Y direction corresponds to an example of a first direction; a Z direction corresponds to a direction which is orthogonal to both the X and the Y directions. The X direction and the Y direction are directions parallel to the surface of the substrate 101, i.e., they generally define the plane of the substrate 101, and the Z direction is a direction orthogonal to the surface of the substrate 101.

A manufacturing method according to an embodiment of the present disclosure includes forming a laminated body on a substrate. The laminated body comprises electrode layers alternately stacked with insulating layers. A mask layer is formed on the laminated body, and then a portion of the mask layer is removed to form an opening having a first dimension. Then, using the mask layer as a template, a first portion of the laminated body is removed by etching to expose a portion of the substrate beneath the laminated body. The removed first portion has a second lateral dimension. The substrate is processed to decrease the ratio between the first and second lateral dimensions. The processing may, for example, involve increasing the lateral (X and/or Y direction) size of the remaining mask layer to decrease the size of the first dimension. Another possibility is that wet etching may be used to remove an additional portion of the laminated body. A variable resistance layer is then conformally deposited on exposed portions of the mask layer, the laminated body, and the substrate. Then the variable resistance layer is processed to remove at least the portion thereof covering the contact plug layer therebelow on the substrate to permit contact with the underlying material, which may, for example, include contact plugs associated with a peripheral circuit for operating the memory device. A second electrode layer is then deposited to fill the removed portions of the laminated body and contact the underlying layer at the base of the trenches.

The manufacturing method of the non-volatile storage device according to the embodiments includes: a process that forms a layered body by alternately stacking multiple electrode layers and multiple insulating layers; a process that forms a mask on top of the layered body; a process that forms multiple grooves that extend in the layering direction and in the first direction that intersects the layering direction, or multiple holes that extend in the layering direction in the layered body and aforementioned mask; a process that makes the dimensions for the second direction that intersects the layering direction and the first direction of the mask relatively longer than the dimensions for the second direction of the layered body, or makes the cross-sectional dimensions of the holes in the mask relatively shorter than the cross-sectional dimensions of the holes in the layered body; a process that forms a variable resistance layer in the inner walls of the multiple grooves, or the aforementioned multiple holes; a process that removes the variable resistance layer formed at the base of the multiple grooves to expose the contact below, or the aforementioned multiple holes; and, a process that forms multiple electrodes to be provided on the inner side of the variable resistance layer, and that connect to the contact plugs in the peripheral circuit region.

In the process that makes the dimensions for the second direction that intersects the layering direction and the first direction of the mask relatively longer than the dimensions for the second direction of the layered body, or makes the cross-sectional dimensions of the holes in the mask relatively shorter than the cross-sectional dimensions of the holes in the layered body, an oxidation process or an ion implantation process is performed on the mask, or a wet etching process is performed on the layered body.

Figure 1B:
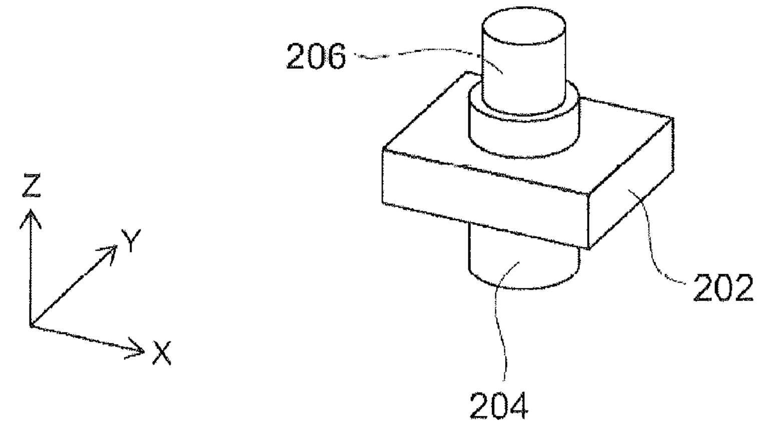
FIG. 1B is a schematic view illustrating vertical channel type memory cells.

FIGS. 1A and 1B are schematic views illustrating a configuration of memory cells.

In addition, FIG. 1A is a schematic view illustrating the memory cells of the vertical gate type, and FIG. 1B is a schematic view illustrating the memory cells of the vertical channel type.

As shown in FIG. 1A, the memory cells of the vertical gate type include an electrode layer 202 that extends in the Y direction, a pair of electrodes 206 with electrode layer 202 interposed between and extending in the Z direction, and a variable resistance layer 204 disposed between the electrode layer 202 and the electrodes 206.

As shown in FIG. 1B, the memory cells of the vertical channel type include the electrode layer 202 that extends in the Y direction, the electrode 206 that pierces through the electrode layer 202 and extends in the Z direction, and a variable resistance layer 204 provided between the electrode layer 202 and the electrode 206 where the electrode extends through the variable resistance layer 202.

First Embodiment

First, a manufacturing method of a non-volatile storage device that has memory cells of a vertical gate type, as illustrated in FIG. 1A, will be described.

Figure 9:
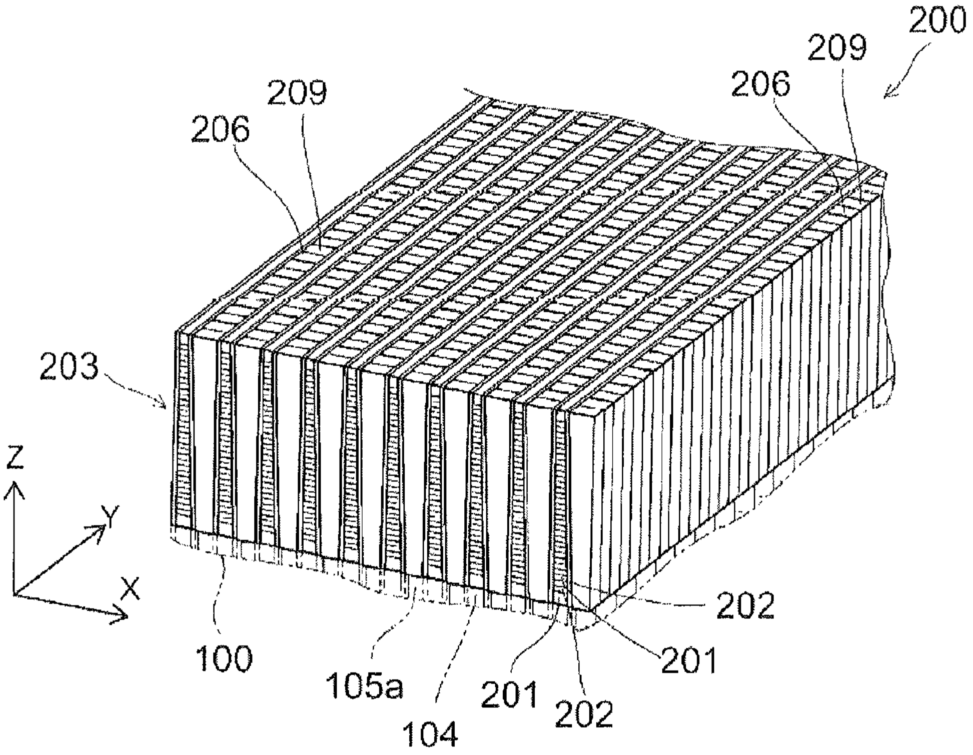
FIG. 9 is a schematic cross-sectional view illustrating a process in the formation of the electrodes.

In this configuration, as shown in FIG. 9. the memory array includes a memory region 200 in which memory cells are provided for storing data, a peripheral circuit region 100 extending downwardly (in the direction of the underlying substrate) therefrom, in which a peripheral circuit is provided for driving the memory cells of the memory region 200, and a contact region in which a contact electrode connects the electrode layer 202 with the upper layer wiring, and an upper layer wiring (and the like) included in the non-volatile storage device.

Figure 2:
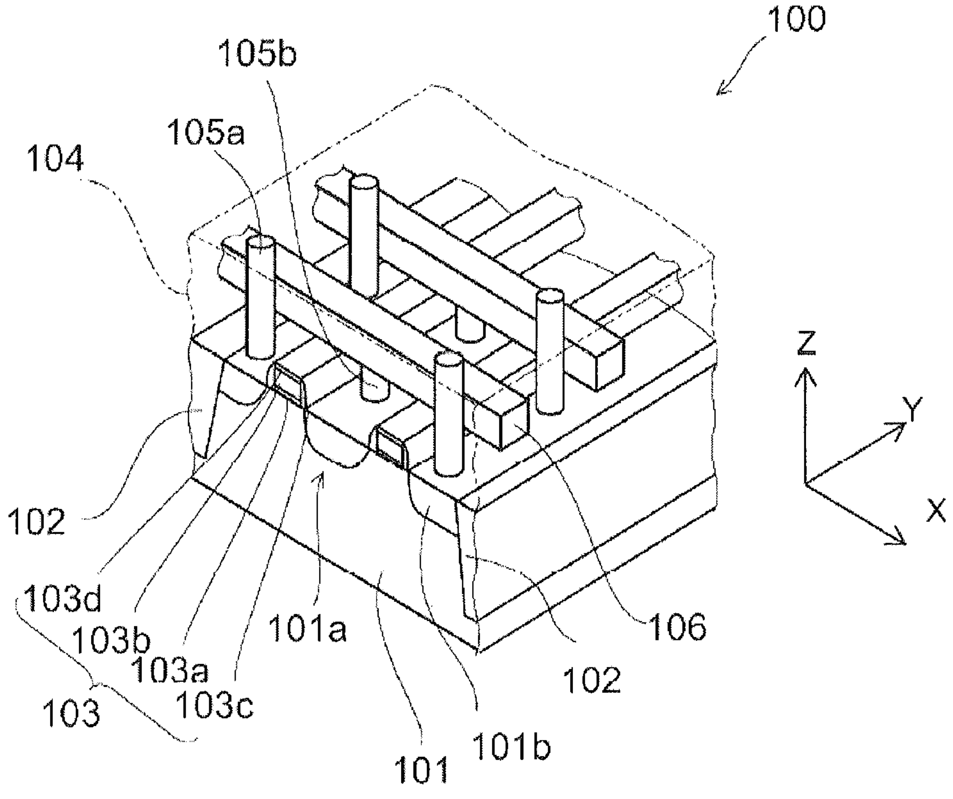
FIG. 2 is a schematic view illustrating a configuration of a peripheral circuit region.

Referring now to FIG. 2, there is depicted a schematic view illustrating a configuration of the peripheral circuit region 100. First, as shown in FIG. 2, by forming an element isolation insulating layer 102 in a previously formed isolation trench by depositing silicon oxide, silicon nitride or similar dielectric materials therein, the surface of a silicon substrate 101 is divided into multiple regions. The regions divided by the element isolation insulating layers 102 are active regions 101*a*.

Next, multiple word lines 103, that extend in the Y direction and are mutually parallel to one another, are formed over the active region 101*a*.

A word line 103 is formed, for example, by forming a gate insulating layer 103*a* from an insulating material such as silicon oxide or silicon nitride; forming a polysilicon, tungsten or other conductor gate electrode 103*b* thereover; forming a sidewall 103*c* using silicon oxide, silicon nitride, or a material with similar insulating properties on the sides of the gate electrode 103*b*; and forming a silicide layer 103*d* from cobalt silicide (or a material with similar properties) over the top of the gate electrode 103*b*.

In the active region 101*a*, between the word lines 103, the source/drain regions 101*b* are formed, for example, by carrying out ion implantation of impurities (dopants) such as arsenic and the like into the silicon substrate.

The word line 103 and source/drain regions 101*b* formed in this manner function as a selection transistor.

Next, to cover the active region 101*a*, the element isolation insulating layer 102, and the word line 103, an insulating layer 104 is formed using silicon oxide (or similar insulating material) Next, multiple contact plugs 105*a* and 105*b* are formed extending through the insulating layer 104 using tungsten and the like. The contact plug 105*a* is connected to electrode 206, as described later, and the contact plug 105*b* is connected to bit line 106.

Next, multiple bit lines 106 that extend in the X direction and are mutually parallel, are formed on top of the contact plugs 105*a* and extend between the contact plugs 105*a*.

It is possible to form the bit lines 106 using for example, polysilicon and tungsten or similar conductive materials.

Moreover, in the formation methods and process conditions of the active region 101*a*, the source/drain regions 101*b*, the element isolation insulating layer 102, the word line 103, the insulating layer 104, the contact plugs 105*a*, 105*b*, and the bit line 106, it is possible to use well-known techniques and detailed process descriptions will be omitted.

Next, the memory region 200 is formed on top of the peripheral circuit region 100. In the following, the illustration of the peripheral circuit region 100 is omitted for reasons of graphical clarity.

Figure 3:
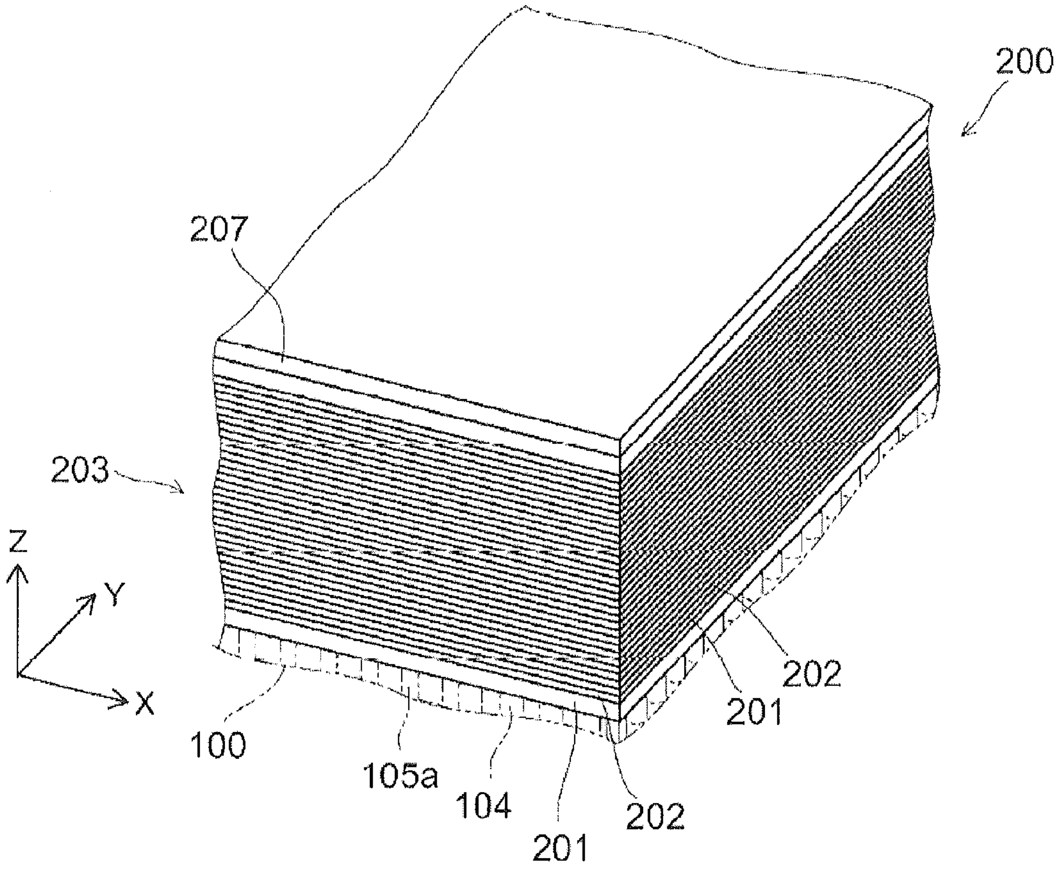
FIG. 3 is a schematic view illustrating a structure of a layered body.

FIG. 3 is a schematic view illustrating a layered body 203 which is converted into the memory region situated over the peripheral circuit region 100.

Figure 4:
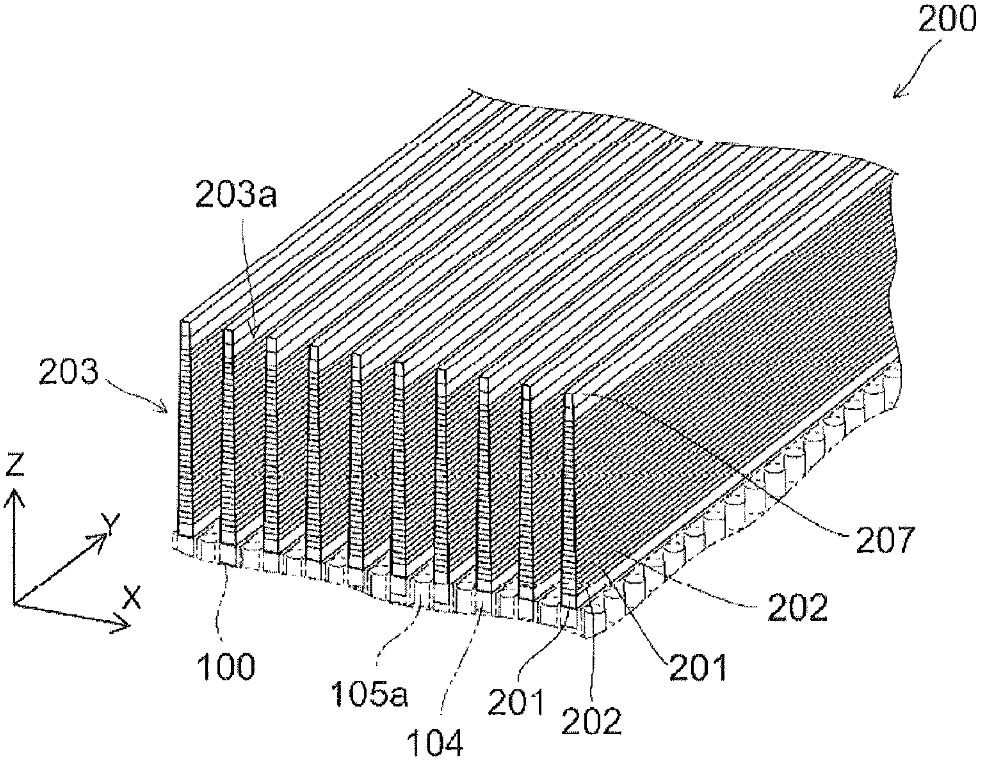
FIG. 4 is a schematic view illustrating grooves formed in the layered body.

FIG. 4 is a schematic cross-sectional view illustrating grooves 203*a* formed in layered body 203.

Figure 5A:
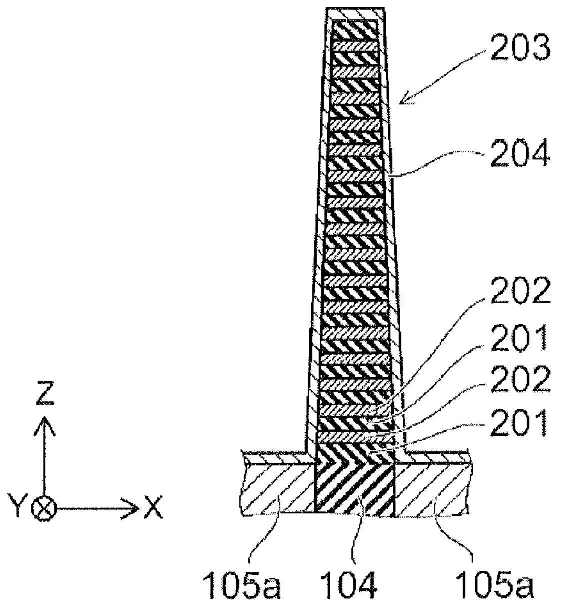
FIG. 5A and FIG. 5B are schematic cross-sectional views illustrating a formation and a removal, respectively, of a variable resistance layer according to a comparative example.
Figure 5B:
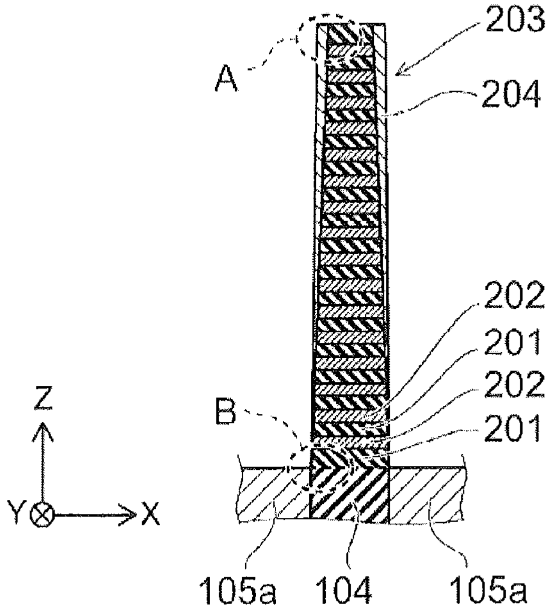

FIG. 5A and FIG. 5B are schematic cross-sectional views illustrating the removal of variable resistance layer 204 according to a comparative example.

Figure 6A:
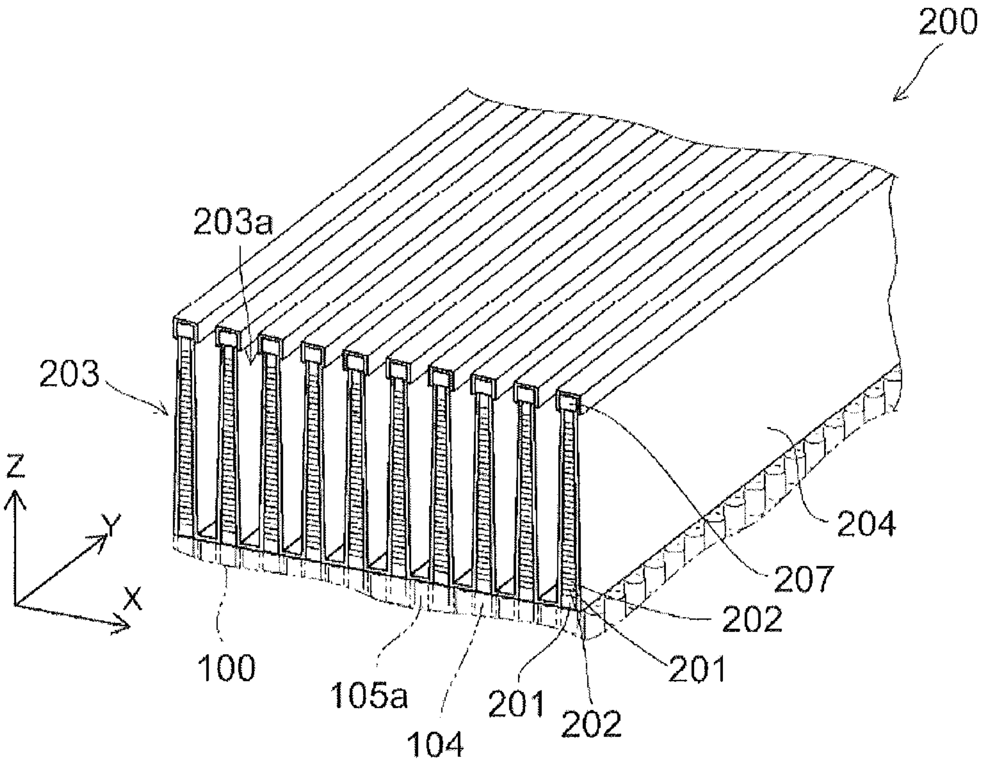
FIG. 6A and FIG. 6B are schematic cross-sectional views illustrating a formation of a variable resistance layer according to a first embodiment.
Figure 6B:
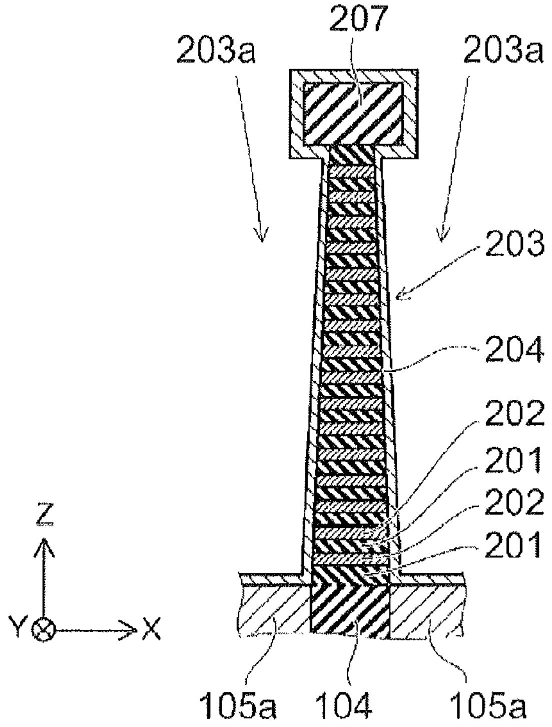

FIG. 6A and FIG. 6B are schematic and cross-sectional views, respectively, illustrating the formation of variable resistance layer 204 according to the first embodiment of the present disclosure.

Figure 7A:
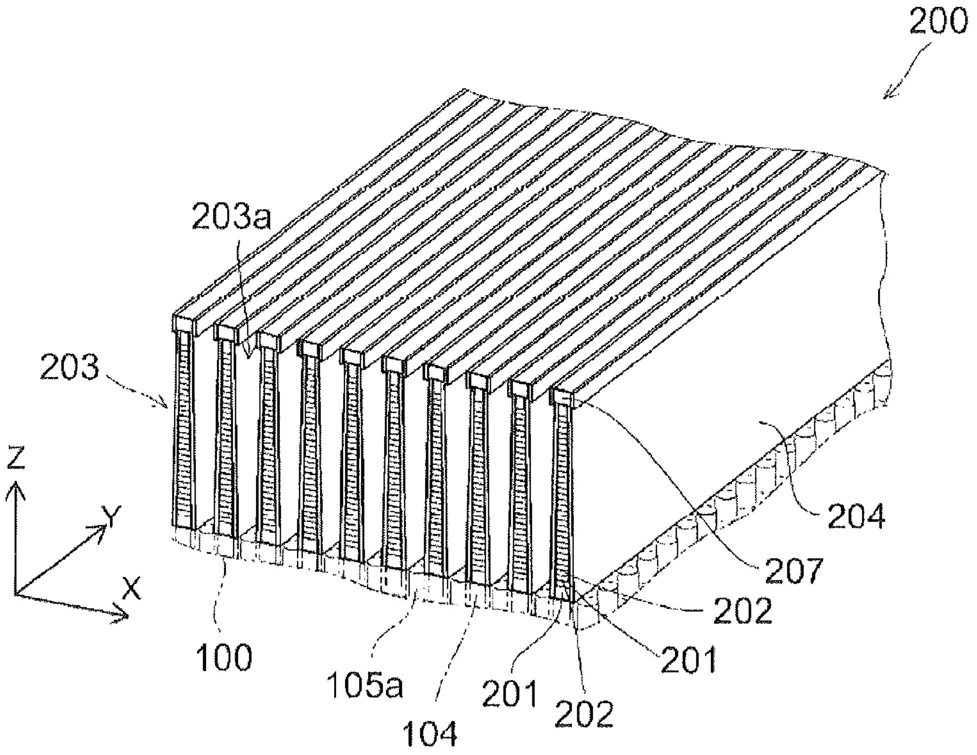
FIG. 7A and FIG. 7B are schematic cross-sectional views illustrating a removal of the variable resistance layer according to the first embodiment.
Figure 7B:
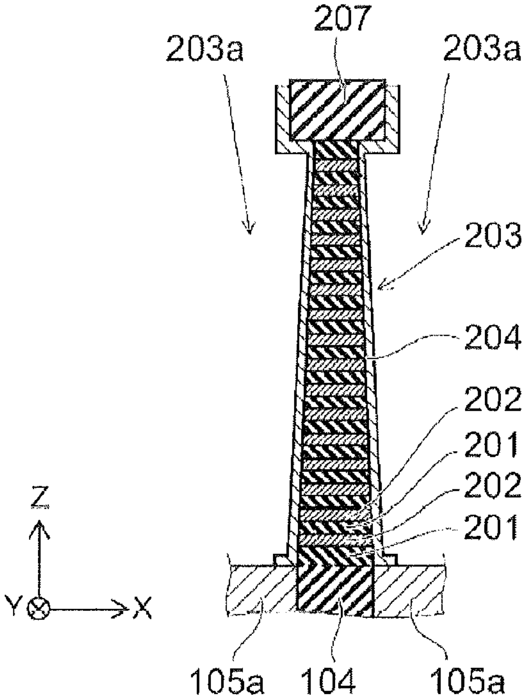

FIG. 7A and FIG. 7B are schematic and cross-sectional views, respectively, illustrating the removal of the variable resistance layer 204 according to the first embodiment.

Figure 8:
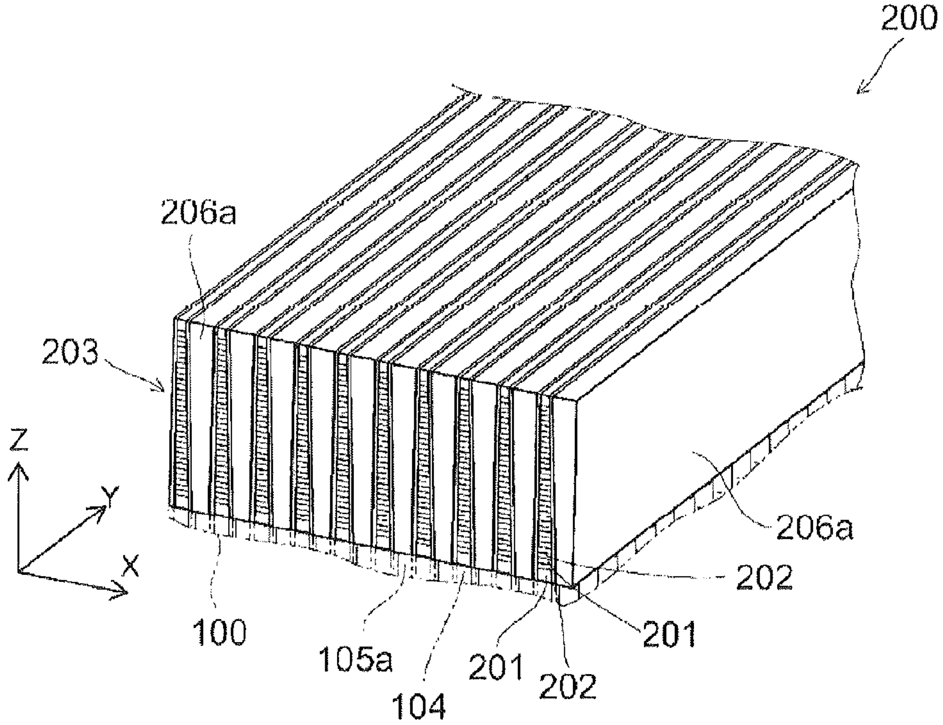
FIG. 8 is a schematic cross-sectional view illustrating a process in the formation of electrodes.

FIG. 8 and FIG. 9 are schematic cross-sectional views illustrating the formation of the electrodes 206.

First, as shown in FIG. 3, on top of the peripheral circuit region 100, an insulating layer 201 is formed using silicon oxide or the like. On top of the insulating layer 201, an electrode layer 202 is formed using titanium nitride or the like. After this, the insulating layer 201 and electrode layer 202 are repeatedly formed in an alternating manner. By alternately stacking insulating layer 201 and electrode layer 202 one over the other a layered body 203 is formed to a desired thickness (or total number of layers).

Then, a masking layer 207 is deposited over the layered body. The masking layer is preferably a hard mask material such as amorphous silicon or the like.

The insulating layer 201 and mask 207 can be formed by using, for example, plasma-enhanced chemical vapour deposition (plasma CVD) methods or the like.

Also, the electrode 202 can be formed by using, for example, a sputtering method or other deposition methods.

In this case, it is possible to form individual insulating layers 201 with a thickness of about 30 nm, individual electrode layer 202 with a thickness of about 40 nm, and a masking layer 207 with a thickness of about 40 nm.

Also, the number of layers of the insulating layer 201 and the electrode layer 202 need not be limited by the example illustrated and can be modified as required by the intended application.

to Then, by applying and patterning a resist using photolithography and development of the resist to form a resist mask which is used to pattern the masking layer 207, and reactive ion etching ("RIE") method to pattern the masking layer and the underlying layered body 203, multiple grooves 203*a* extending in the Z and Y directions through the mask 207 and the layered body 203 are formed.

Under these circumstances, the grooves 203*a* are formed so as to extend to the upper surface of the contact plug 105*a* of the peripheral circuit region 100.

Here, as the grooves 203*a* are formed in the layered body 203, that is, formed from multiple insulating layers 201 and multiple electrode layers 202, the internal dimensions of the grooves 203*a* in the X direction will generally become smaller towards the base of the grooves 203*a* (that is, towards bottom of the layered body 203). Therefore, it will be a case wherein the layered body 203 remaining after grooves 203*a* are formed will be tapered in a truncated conical cross section. Grooves 203*a* will be wider in the X direction at the upper portion of layered body 203 than at the bottom portion of layered body 203. Conversely, the remaining portions of layered body 203 will be narrower in the X direction at the upper portion than at the lower portion thereof.

Thereafter, as shown in FIG. 5A, the variable resistance layer 204 is conformally deposited so as to cover the layered body 203, so that the variable resistance layer 204 has a generally uniform thickness over the sides of the tapered layered body 203.

In order to connect the electrode 206 with the contact plug 105*a*, described later, the variable resistance layer 204 at the base of the groove 203*a* is removed.

Thereafter, using a directional etching techniques such as reaction ion etching, the variable resistance layer 204 at the base of the groove 203*a* is removed as shown in FIG. 5B.

However, when the variable resistance layer 204 at the base of the groove 203*a* is removed using reactive ion etching methods or the like, the thickness of the variable resistance layer thins, i.e., is etched to a greater depth at the lower portions of the layered bodies 203, and at the base of the layered bodies 203 (region B), adjacent to the top of the contacts 105*a*, the variable resistance layer 204 may be completely removed, yet the variable resistance layer is barely removed, at the top of the layered bodies 203 (region A) as shown in FIG. 5B. Yet, to function properly, the thickness of the variable resistance layer 204 on the layered body 204 need be uniform.

In addition, in FIG. 5A and FIG. 5B, although the case wherein the formation of the layered body 203 with tapering present is illustrated, there is also a case wherein the layered body 203 with reverse tapering present is formed. That is, the internal dimensions of the grooves 203*a* in the X direction become greater towards the base of the grooves 203*a*, rather than less as described above.

When the layered body 203 with reverse tapering present is formed, some portions of the variable resistance layer 204 formed at the upper portion of the layered body 203 get removed during the process of removal of variable resistance layer 204 from the space between the layered bodies 203 at the base thereof for allowing electrode 206 to connect with contact plug 105*a*.

Therefore, even in the case wherein the layered body 203 with reverse tapering present is formed, the thickness of the variable resistance layer 204 at the upper portion and lower portion of the layered body 203 will vary, and there is a still danger of variations occurring in the memory characteristics.

Accordingly, as shown in FIG. 6A and FIG. 6B, by increasing the dimensions in the X direction of the mask 207 relative to the existing groove 203*a* dimension at the upper portion of layered body 204 prior to the etching of the variable resistance layer 204 using a directional etching technique, the change of the thickness of the variable resistance layer 204 along sidewall depth of groove 203*a* is suppressed.

That is, as shown in FIG. 6A and FIG. 6B, the dimension of the mask 207 in the X direction is made relatively wider than the largest dimension in the X direction of the layered body 203, and as a result the sides of the wider masking layer 207 remaining after the initial pattern etch overhangs the opening of the grooves 203*a* and also shadows, in a direction generally normal to the underlying substrate, the variable resistance coating 204 on the layered bodies and a small portion thereof extending from the base of the layered bodies 203 over the underlying contacts 105*a*.

For example, after the formation of the grooves 203*a* illustrated in FIG. 4, it is possible to widen) the dimensions of the remaining masking layer 207 in the X direction.

In this case, after the formation of the grooves 203*a*, by carrying out an oxidation treatment on the remaining masking layer 207 to grow an oxide on the underlying silicon material of the masking layer 207, the overall size of the masking layer is enlarged, and thus the masking layer 207 may be widened in the X direction in the x direction to overhang the openings of the trenches 203*a*.

Alternatively, it is possible to swell the size of the mask using ion implantation techniques, for example, by implanting oxygen into the masking layer 207, and thereby cause the masking layer to widen and overhang the openings of the trenches 203*a*.

Also, after the formation of the grooves 203*a* illustrated in FIG. 4, it is possible to shorten (reduce) the dimensions of the layered body 203 in the X direction.

In this case, after the formation of the grooves 203*a*, by carrying out a wet etching process on the layered body 203, it is possible to decrease the dimension of the layered body 203 in the X direction. Because the materials of the insulating layer 201 and the materials of the electrode layer 202 differ, it is possible to differentiate and selectively carry out the wet etching process for the insulating layer 201 and the wet etching process for the electrode layer 202.

For example, for an insulating layer 201 formed from silicon oxide, the wet etching process can be carried out using an etching solution that contains hydrofluoric acid.

Also, for the electrode layer 202 formed from titanium nitride and the like, the wet etching process can be carried out using an etching solution that contains sulfuric acid. By wet etching the layered body 203, the layered body will have a width in the x direction less than that of the masking layer 207, and thus the masking layer 207 will overhang the opening of the now enlarged trenches 203*a*.

There is no limitation in particular for the dimensions of the remaining masking layer 207 in the X direction, as long as it projects from the upper end of the layered body 203 towards the inner portion of the groove 203*a* to the extent required to prevent the substantial removal of the variable resistance layer 204 formed at the lower portion of the layered body 203 during the removal of the variable resistance layer 204 from the bottom surface of groove 203*a*. Preferably, the overhang of the masking layer 207 over the openings of the trenches 203*a* is performed prior to the deposition of the variable resistance layer 203.

The variable resistance layer 204 is formed so as to cover the layered body 203 and mask 207. That is, the variable resistance layer 204 is formed in the inner wall of the multiple grooves 203*a* and over the surface of mask 207.

It is possible to form the variable resistance layer 204 using, for example, plasma enhanced chemical vapour deposition of a metal oxide to form a conformal thin film layer on the order of 5 nm thick.

It is possible to make the metal oxides to be metal oxides of a two component system, such as $AlO_x$, $TiO_x$, $NiO_x$, $HfO_x$, $MnO_x$, $TaO_x$, $ZrO_x$, $CoO_x$ or $IrO_x$ and the like, or metal oxides of a three component system with an additional element added to these, or a multi component system metal oxide (Metal1-Metal2-$O_x$) in which these are combined, etc.

Next, as shown in FIG. 7A and FIG. 7B, the variable resistance layer 204 formed at the base of the multiple grooves 203*a* is removed using an anisotropic etching method, such as reactive ion etching, to expose the contact plugs 105*a* underlying the grooves 203*a*. Simultaneously, The variable resistance layer 204 formed on the top surface of the mask 207 is removed.

Here, as shown in FIG. 7B, when the variable resistance layer 204, present at the base of the grooves 203*a*, is removed using the anisotropic etching method, the variable resistance layer 204 present at the lower regions of the mask 207 will not be removed. That is, it is possible to prevent the removal of the variable resistance layer 204 formed at the lower portion of the layered body 203 by having the masking layer 207 extend past the upper portion of layered body 203 and overhang the openings of the trenches 203*a*.

Therefore, since the thickness of the variable resistance layer 204 at the upper portion and lower portion of the layered body 203 will be approximately the same, it will be possible to suppress variations in the memory characteristics due to variations invariable resistance layer 204 thicknesses along the sidewall depth of groove 203*a*.

After etching the portion of the variable resistance layer 204 overhanging the contacts 105*a* at the base of the grooves 203*a* within the grooves 203*a* layers 206*a*, which will become the electrodes 206, are deposited (that is, the grooves 203*a* are filled with layer 206*a*), resulting in the structure of FIG. 8. For example, by using a plasma CVD method to form the layers 206*a* inside the grooves 203*a* and then by using CMP (Chemical Mechanical Polishing) to flatten the upper surface, the layers 206*a*, which will become the electrodes, 206 are formed. In addition, when flattening the upper surface, the masking layers 207 are removed.

The layers 206*a* can be formed, for example, from polysilicon or tungsten. If the layers 206*a* are made of polysilicon, the manufacturability can be improved. If the layers 206*a* which will become the electrodes 206 are made of tungsten, the electrical resistance can be reduced.

Thereafter, the polished surface of the electrode 206 material in the grooves 203*a* and layered stacks 203 are patterned, and the electrode material is etched using reactive ion etching, to form a multiplicity of individual, columnar electrodes 206 extending between the adjacent layered bodies 203, the upper surfaces of which are shown in FIG. 9.

That is, the multiple electrodes 206 are formed disposed inside the grooves 203*a* and are connected to the contact plugs 105*a* of the peripheral circuit region 100, such that a single electrode is formed over, and in contact with, the upper surface of a contact plug 105*a*. Additionally, the multiple electrodes 206 are formed in such a way that they oppose each other, i.e., are aligned in the x direction, across the intervening layered body 203 and variable resistance layer 204.

Thereafter, individual insulating plugs 209 are deposited within the gaps between adjacent electrodes 206. For example, by using a LPCVD (Low Pressure Chemical Vapor Deposition) method or spin coating (Spin Coating) method, a silicon oxide (or the like) layer is formed between and over the electrodes 206, are formed, and by using a CMP method or other polishing method, the upper surface extending on the top of the electrodes is polished away leaving the insulating layers 209 embedded between each electrode 206.

In the manner as described above, memory region 200 can be formed on top of peripheral circuit region 100.

In a second embodiment, the forming of a memory region having a uniform thickness variable resistance layer is accomplished without the need to form an overhanging masking layer. In this embodiment, a protective film in employed to protect the variable resistance layer during the etching of the portion thereof overlying the contact plug at the base of the trench.

Figure 10A:
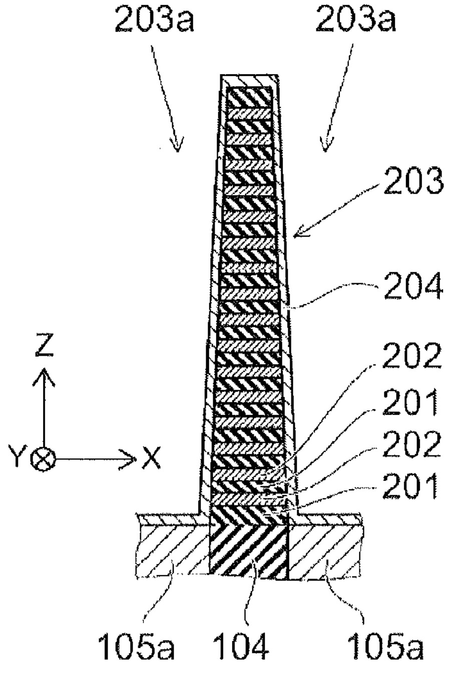
Figure 10B:
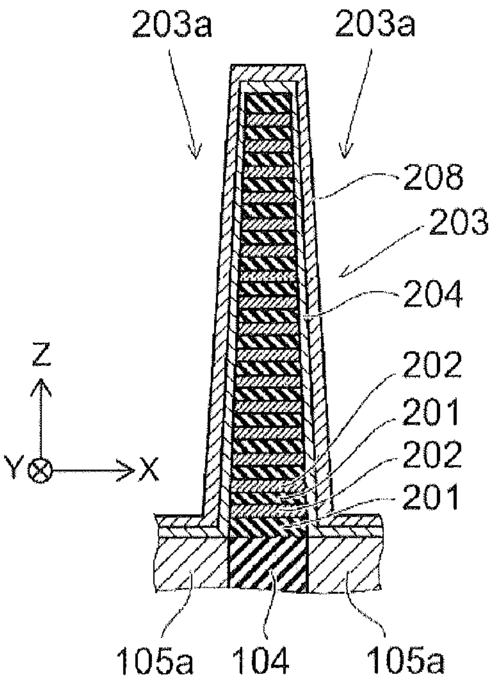
Figure 10C:
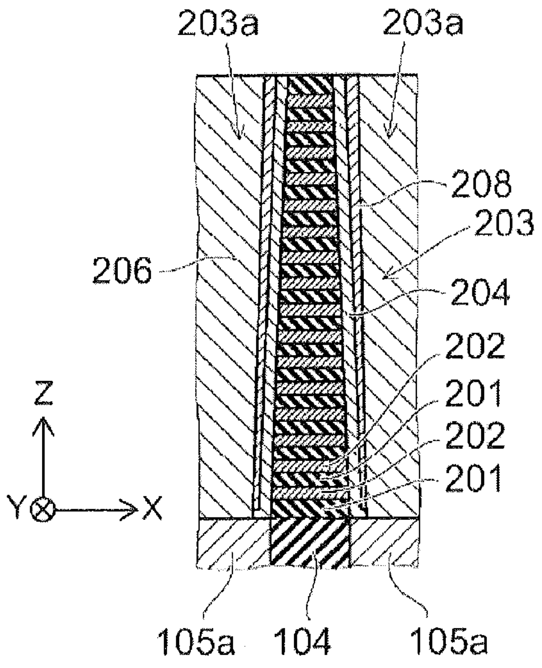

FIG. 10A to FIG. 10C are schematic cross-sectional views to illustrate the formation of the variable resistance layers 204 according to an additional embodiment of the present disclosure.

FIG. 6A and FIG. 63 illustrate an embodiment in which mask 207 are formed on top of laminated bodies 203 and the variable resistance layer 204 is not removed.

In contrast, FIG. 10A to FIG. 10C illustrate an embodiment in which protective layers 208 are formed over the variable resistance layer 204, and the variable resistance layer 204 formed on the sidewalls of laminated bodies 203 are not removed.

First, as shown in FIG. 10A, the variable resistance layers 204 is formed on the inner wall of multiple grooves 203*a*. The formation of the variable resistance layer 204 can be the same as illustrated in FIG. 6A and FIG. 6B Thereafter, as shown in FIG. 10B, on the exposed surface the variable resistance layers 204, at protective layer 208 is formed. The protective layer 208 can be formed with electrically conductive materials. In this case, the protective layer 208 can be, for example, formed with the same materials as electrodes 206. The protective layers 208 can be formed, for example, by using CVD methods.

There is no particular limit on the thickness dimensions of the protective layer 208. When removing the protective layers 208 and the variable resistance layers 204 at the bottom of the grooves 203*a* by using the anisotropic etching method, it is preferable to use a protective layer 208 thickness which prevents significant removal of the variable resistance layer 204 formed at the lower portion of the laminated body 203.

After that, as shown in FIG. 10C, removal of protective layer 208 and variable resistance layer 204 formed at the bottom of multiple grooves 203*a* by using anisotropic etching method can be achieved.

At this time, by removing the protective layer 208 and the variable resistance layer 204 at the bottom of multiple grooves 203*a*, the underlying contact plugs 105*a* will be exposed.

It should be noted that when removing the protective layer 208 and variable resistance layer 204 at the bottom of the grooves 203*a*, the portion of the protective layer 208 and variable resistance layer 204 formed on the upper face of laminated bodies 203 are also removed. An anisotropic etching method can be used, for example, such as reactive ion etching method.

Here, as shown in FIG. 100, by using the anisotropic etching method, when removing protective layers 208 and variable resistance layers 204 at the bottom of the grooves 203*a*, some portion of the protective layer 208 formed on the lower portion of laminated body 203 is removed, but the variable resistance layer 204 is not removed.

Therefore, since the thickness of the variable resistance layers 204 is about the same on the upper portion as on the lower portion of laminated bodies 203, the variation that occurs in the memory properties due to variation in variable resistance layer 204 can be suppressed.

Subsequently, as was illustrated in FIG. 8, layers 206*a* which will become electrodes 206 are embedded inside the grooves 203*a*.

After that, as was illustrated in FIG. 9, multiple electrodes 206, which extend in the direction Z of the laminated bodies 203, are formed.

This means the multiple electrodes 206 are disposed inside the variable resistance layers 204 and connected to the contact plugs 105*a* of the peripheral circuit region 100. As protective layers 208 are formed between layers 206*a* and variable resistance layers 204, the sides of the individual electrodes 206 will include protective layers 208. Additionally, during the directional etching step where the material filling the grooves 203*a* is etched into individual electrodes, the portion of the protective layer 208 overlying the variable resistance layer 204 in the region between the individual electrodes 206 must also be removed to ensure isolation of the individual electrodes 206 from one another. In this embodiment, because protective layers 208 are formed with electrically conductive materials, the functions of electrodes 206 can still be accomplished. In addition, if protective layers 208 are formed using the same materials as electrodes 206, the protective layers 208 will, in effect, be integrated to the electrodes 206.

Second Embodiment

Next, a manufacturing method of the non-volatile storage device that has memory cells of the vertical channel type, as illustrated in FIG. 1B, will be described.

It should be noted that, even in the case of the manufacturing method of the non-volatile storage device that has memory cells of the vertical channel type, the peripheral circuit region 100 may still be configured as illustrated in FIG. 2. Therefore, the following illustrates the formation of the memory region 200*a*.

Figure 11:
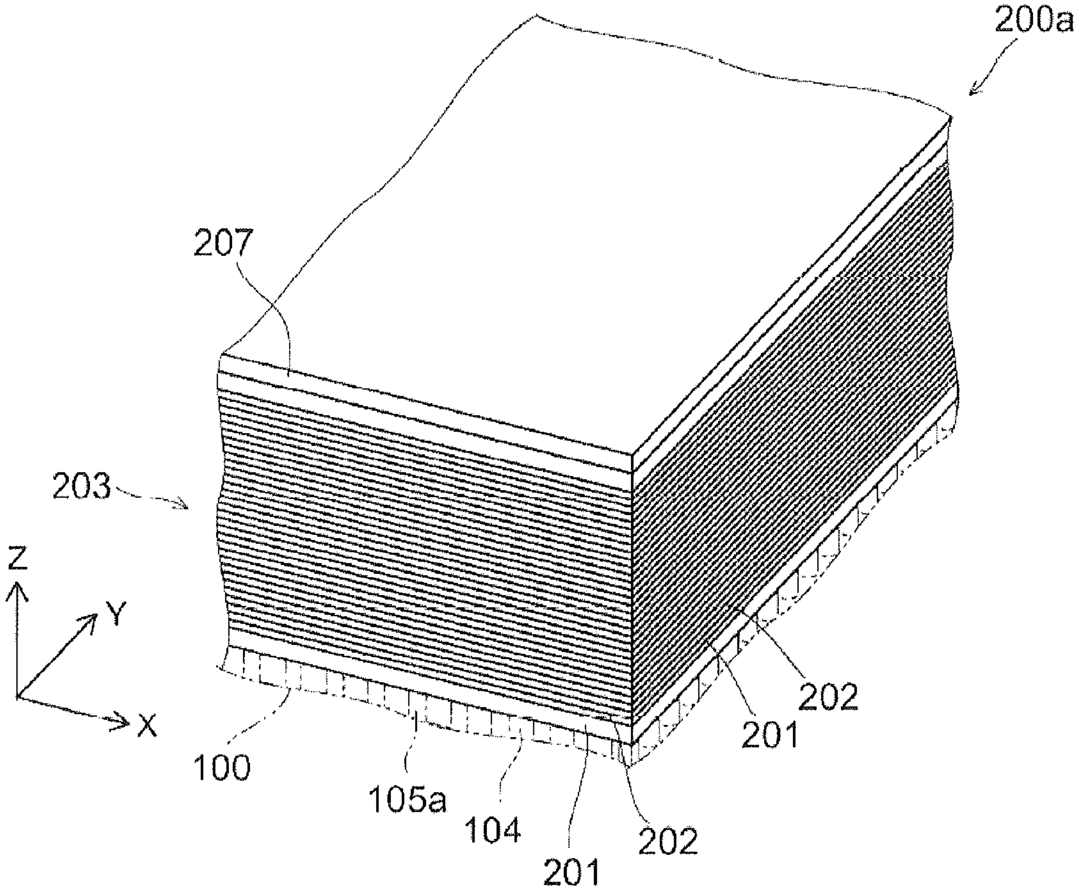
FIG. 11 is a schematic view illustrating a structure of a layered body.

FIG. 11 is a schematic view illustrating the configuration of the laminated body 203.

Figure 12:
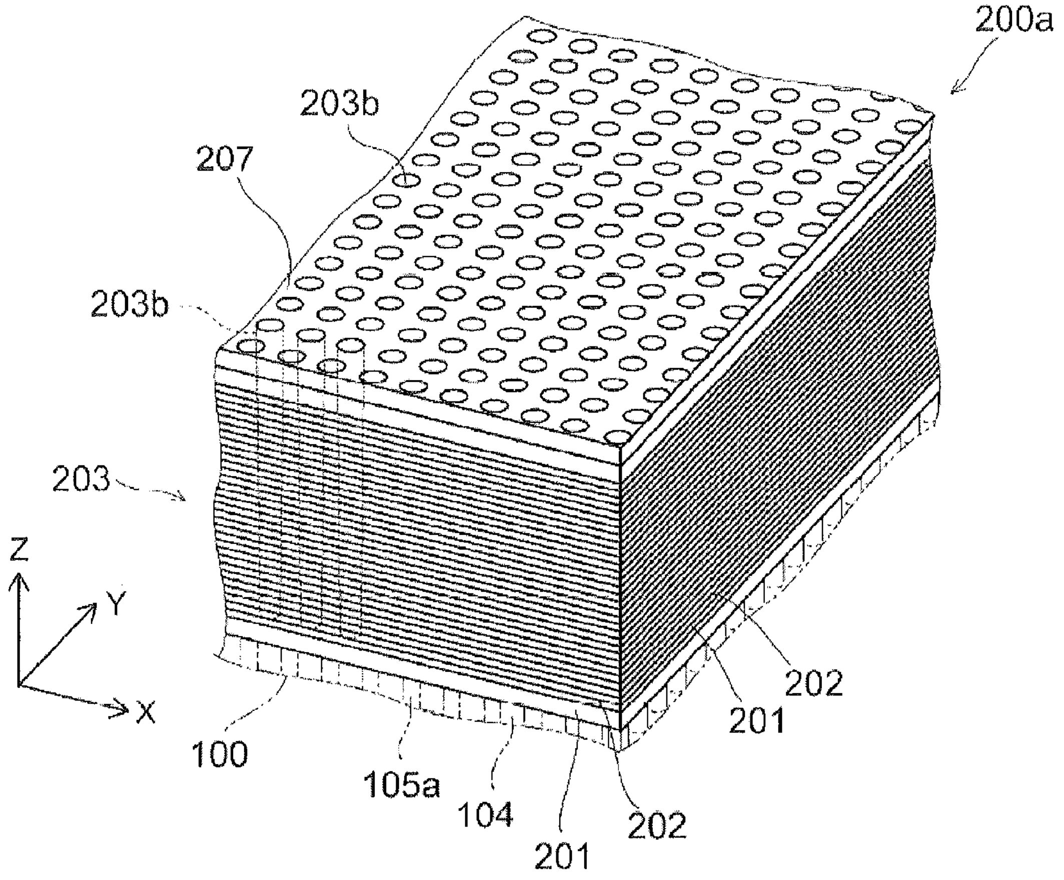
FIG. 12 is a schematic view illustrating holes formed in the layered body.

FIG. 12 is a schematic view illustrating holes 203*b* extending inwardly of the laminated body 203.

Figure 13A:
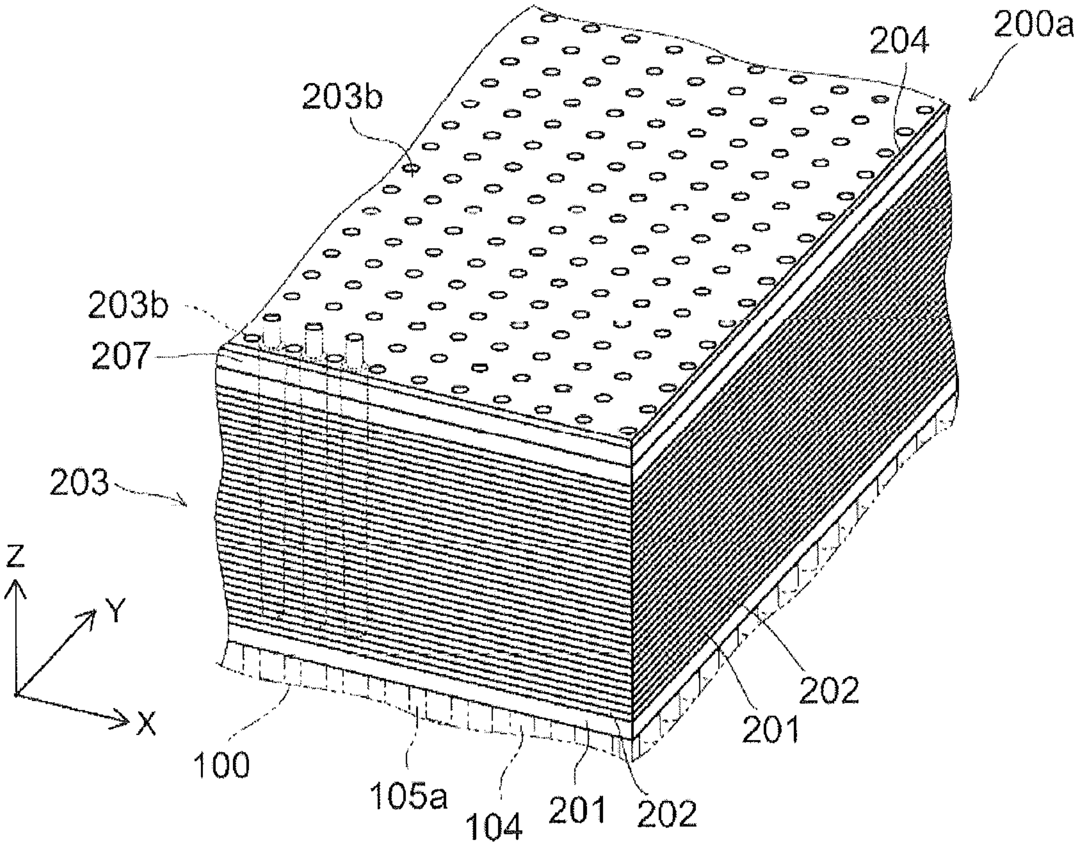
FIG. 13A and FIG. 13B are schematic and cross-sectional views, respectively, illustrating a formation of a variable resistance layer according to a second embodiment.
Figure 13B:
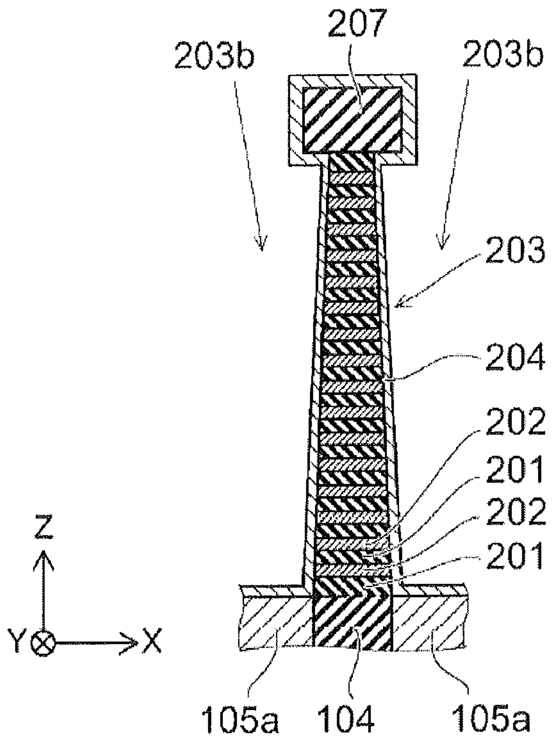

FIG. 13A and FIG. 13B are schematic and cross-sectional views, respectively, illustrating the formation of the variable resistance layers 204 according to this embodiment.

Figure 14A:
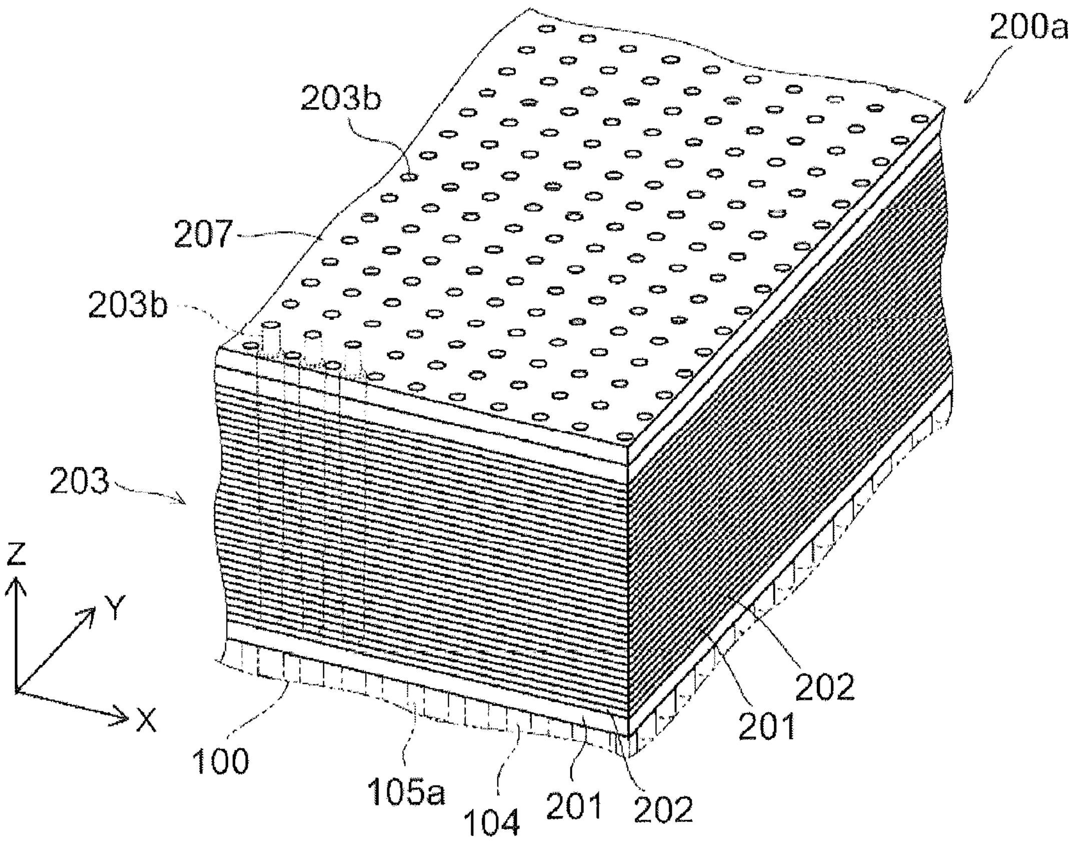
FIG. 14A and FIG. 14B are schematic and cross-sectional views, respectively, illustrating a removal of the variable resistance layer according to the second embodiment.
Figure 14B:
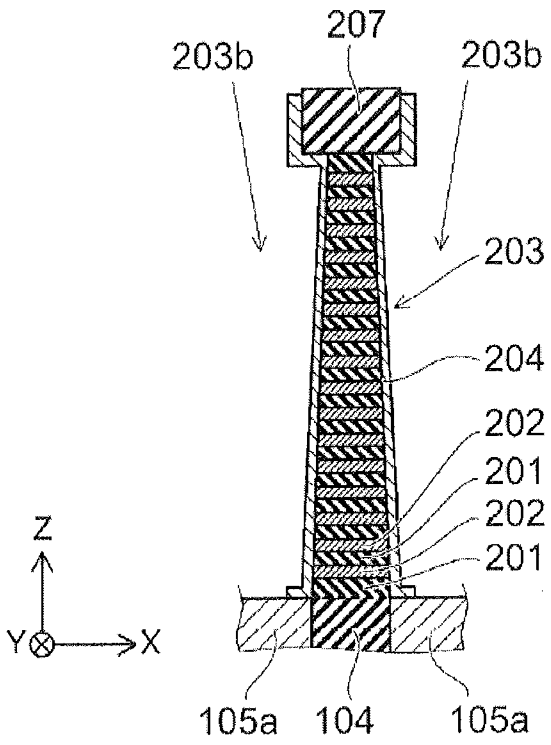

FIG. 14A and FIG. 14B are schematic and cross-sectional views illustrating the removal of the variable resistance layers 204 according to this embodiment.

Figure 15:
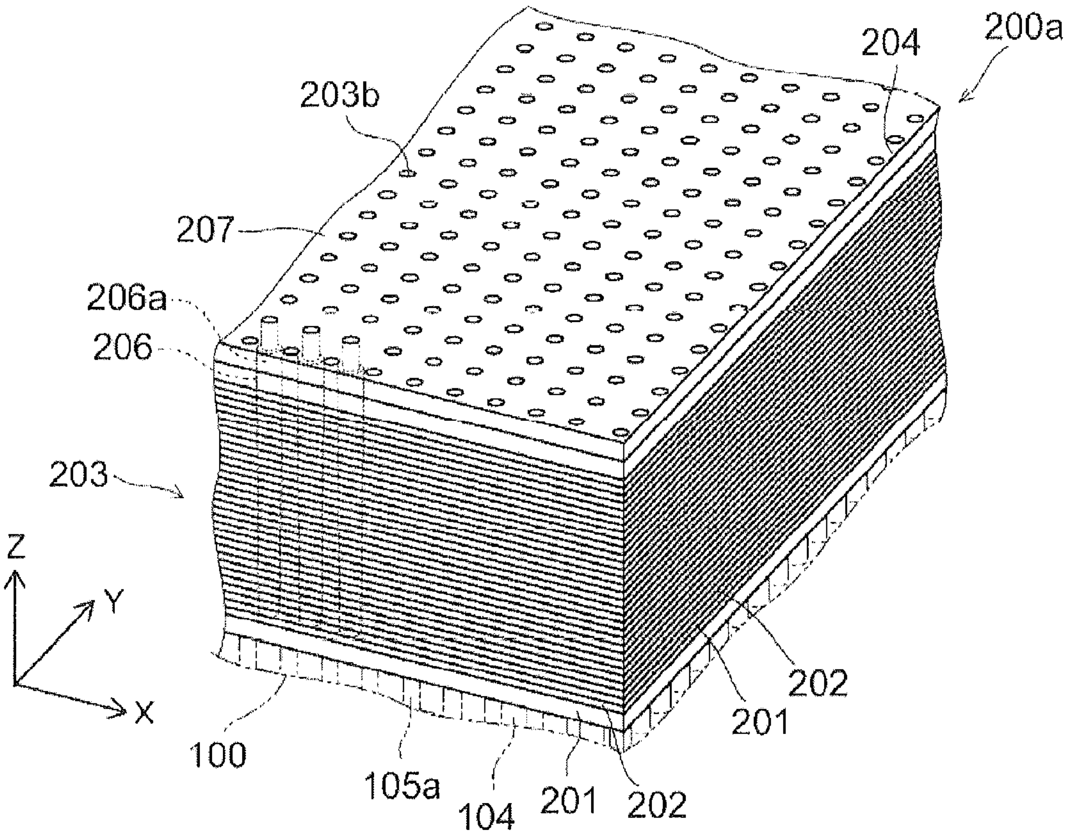
FIG. 15 is a schematic view illustrating a process in the formation of the electrodes.

FIG. 15 is a schematic view illustrating the formation of the electrodes 206.

Referring now to FIG. 11, an insulating layer, composed of an insulator such as silicon oxide or the like is deposited over the peripheral circuit region 100. Over the insulating layer 201, electrode layer 202 is formed by depositing an electrode material such as titanium nitride or the like. Thereafter, insulating layers 201 and electrode layers 202 are repeatedly formed in an alternating manner. That is, multiple insulating layers 201 and multiple electrode layers 202 are alternately deposited one atop the other to form laminated body 203.

After that, over laminated body 203, an amorphous silicon or the like masking layer 207 are deposited.

It should be noted that the formation of laminated body 203 or masking layer 207 are as depicted with respect to FIG. 3. Therefore, the details related to the formation of laminated body 203 and masks 207 are omitted here.

Thereafter, using photolithography to form a patterned mask out of the masking layer 207 and reactive ion etching thereafter, holes 203*b* extending through the masking layer 207 and the laminated body 203 in the Z direction are formed to reach The upper face of contact plugs 105*a* of the peripheral circuit region 100 *z* (shown in FIG. 2).

Here, if the holes 203*b* are formed in the laminated body 203, which include multiple insulating layers 201 and multiple electrode layers 202, the section dimensions of the holes 203*b* (the dimensions in the X direction and in the Y direction) will generally taper from a large diameter or width at the upper portion of the laminated body 203 (top of hole 203*b*) to a lower diameter or width at the lower portion of laminated body 203 (bottom of hole 203*b*). Therefore, the faces of the laminated body 203 exposed inside the holes 203*b* are inclined with respect to an imaginary vector extending vertically from the underlying substrate surface (sidewalls are less than perfectly vertical).

In this case, as illustrated in FIG. 5A, in order to cover the inner wall of the holes 203*b*, when the variable resistance layer 204 are deposited, it will be formed along the slope, or side wall, of the laminated body 203 on the side of the groove 203*a*.

Thereafter, as previously described, where the variable resistance layer 203 material at the base of the groove is etched to expose the underlying contacts plug 105*a*, so that the later deposited electrode 206 may make contact with the plug 105*a*, a part of the variable resistance layer 204 formed at the lower part of the hole 203*b* will generally also be removed.

Therefore, the thickness of the variable resistance layers 204 changes along the length of the side of the groove 203*a*, such that it is thickest at the top and thinner, or completely etched away, at the bottom of the groove 203*a*, which might cause variation of the memory properties of the resulting memory cell.

As shown in FIG. 13A and FIG. 13 B, the cross-sectional dimensions of the opening of the holes 203*b* is decreased by increasing the size of the masking layer 207. That is, then as shown in FIG. 13A and FIG. 13 B, the cross-sectional dimensions of the portion of holes 203*b* through the mask layer 207 are less than the portion of holes 203*b* extending in the laminated body 203.

For example, after the formation of the holes 203*b* illustrated in FIG. 12, the cross-sectional dimensions of the holes 203*b* where they extend through the masking layer 207 can be reduced.

In this case, after the formation of the holes 203*b*, oxidation treatment is performed with respect to the masking layer 207 which causes the masking layer 207 to swell (increase in size) to thereby reduce the cross-sectional dimension of the portion of holes 203*b* extending through the mask layer. In addition, after the formation of the holes 203*b*, ion implantation can also be performed with respect to the masking layer 207 to increase the size of mask 207 to thereby reduce the cross-sectional dimension of the portion of holes 203*b* extending through the masking layer 207.

Alternatively, or additionally, after the formation of the holes 203*b* illustrated in FIG. 22, the cross-sectional dimensions of the portion of the holes 203*b* through the laminated body 203 can be increased. For example, after the formation of the holes 203*b*, a wet etching process is performed with respect to the laminated bodies 203 and the cross-sectional dimensions of the portion of the holes 203*b* in the laminated body 203 can be increased.

At this time, as the materials of insulating layers 201 and the materials of electrode layers 202 are different, the wet etching process performed with respect to the insulating layers 201 and the wet etching process performed for the electrode layers 202 can be carried out separately.

For example, for the insulating layers 201 which include silicon oxide, a wet etching process that uses an etching solution including hydrofluoric acid can be carried out.

Then, for the electrode layers 202 that include titanium nitride, a wet etching process that uses an etching solution including sulfuric acid can be carried out.

Subsequently, the variable resistance layer 204 is deposited so as to cover the laminated body 203 and the masking layer 207. This means, the variable resistance layer 204 is formed on the inner wall of the multiple holes 203*b*.

The materials, the thickness, and the method of formation and the like of the variable resistance layer 204 can be the same as those previously described.

Thereafter, the variable resistance layer 204 disposed at the bottom of holes 203*b* is removed by using an anisotropic etching method as is shown in FIG. 14B. At this time, by removing the variable resistance layer 204 disposed at the bottom of holes 203*b*, multiple contact plugs 105*a* are exposed.

It should be noted that when removing the variable resistance layer 204 disposed at the bottom of holes 203*b*, the variable resistance layer 204 disposed on the upper face of mask layer 207 is also removed. An anisotropic etching method can be used, for example as reactive ion etching method or the like.

Here, as shown in FIG. 14B, by using the anisotropic etching method, when removing the variable resistance layer 204 disposed on the bottom of holes 203*b*, the variable resistance layer 204 disposed on the lower side of mask layer 207 will not be removed because the portion of the masking layer 207 overhanging the opening of the hole 203*b* masks the side wall of the hole 203*b*, and thus the variable resistance layer 207 thereon, from direct ion bombardment and thus from substantial etching thereof. This means that it is possible to not remove the variable resistance layer 204 disposed at the lower portion of the laminated body 203.

Therefore, as the thickness of the variable resistance layer 204 is about the same in the upper portion as in the lower portion of the laminated body 203, the variation that occurs in the memory properties can be suppressed.

Then, as shown in FIG. 15, electrodes 206 are formed within the holes 203*b*. This means the multiple electrodes 206 are formed by being deposited on the variable resistance layer 204 within the holes 203*b* and connected to the contact plugs 105*a* of the peripheral circuit region 100 at the base of the hole 203*b*.

For example, by using a CVD method or the like, the layers 206*a* which will become the electrodes 206 inside the holes 203*b* are formed, then by using a CMP method or the like to polishing off the electrode material on the upper surface, the electrodes 206 are embedded inside the holes 203*b*. It should be noted that, when polishing the upper surface by polishing (e.g., CMP), it is also preferable to remove the mask layer 207.

The layers 206*a* which become the electrodes 206 can be formed, for example, from polysilicon or tungsten. If the layers 206*a* which will become the electrodes 206 are made of polysilicon, the manufacturability can be improved. If the layers 206*a* which will become the electrodes 206 are made of tungsten, the electrical resistance can be reduced.

At this time, the multiple electrodes 206 are respectively connected to the contact plugs 105*a*.

In the manner as described above, memory region 200*a* can be formed on top of peripheral circuit region 100.

Next, formation of the variable resistance layers 204 according to additional embodiments is described.

Figure 16A:
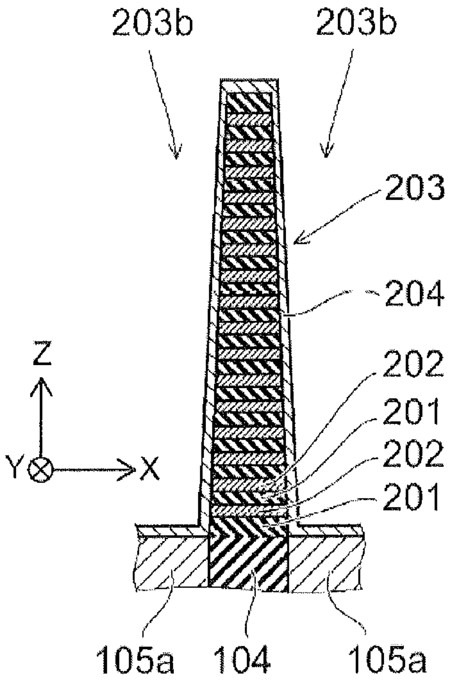
FIG. 16A to FIG. 16C are schematic cross-sectional views illustrating a formation of the variable resistance layer using a protective layer according to certain embodiments.
Figure 16B:
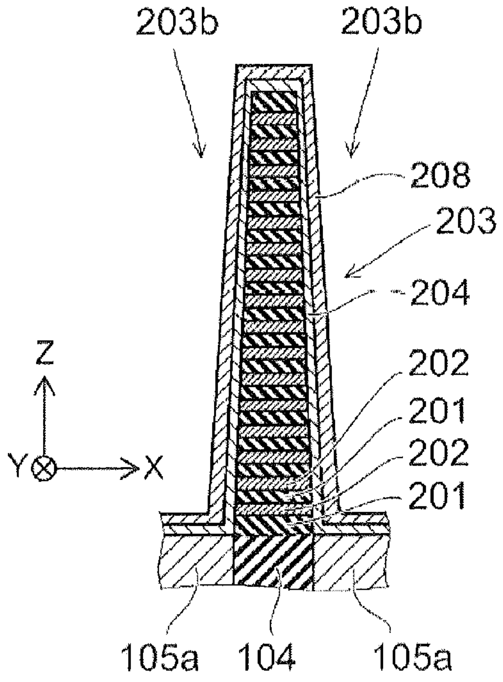
Figure 16C:
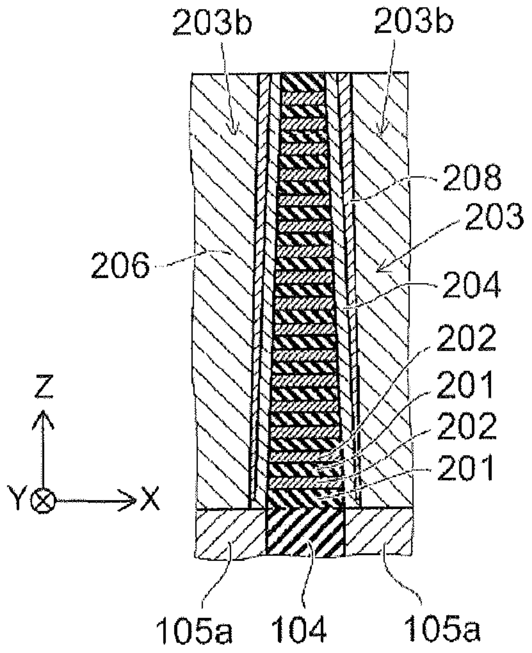

FIG. 16A to FIG. 16C are the schematic cross-sectional views illustrating the formation of the variable resistance layer 204 according to additional embodiments.

In FIG. 13A and FIG. 13B for example, the masks 207 are formed on top of laminated body 203 and the variable resistance layer 204 disposed under the laminated body 203 is not to be removed.

On the other hand, in FIG. 16A to FIG. 16C, the protective layer 208 is formed on top of the variable resistance layer 204 and the variable resistance layer 204 disposed under the laminated body 203 is not removed.

First, as shown in FIG. 16A, the variable resistance layer 204 is formed on the inner walls of grooves 203*b*. The formation of the variable resistance layer 204 can be the same as illustrated in FIG. 13A and FIG. 13B.

After that, as shown in FIG. 16B, on the upper surface (the exposed surface) of the variable resistance layer 204, the protective layer 208 is disposed. The protective layer 208 can be formed with electrically conductive materials.

In this case, the protective layer 208 can be, for example, formed with the same materials as electrodes 206. The protective layer 208 can be formed, for example, by using CVD method or the like.

There is no particular limit on the thickness dimensions of the protective layers 208, when removing the protective layers 208 which is at the bottom of the holes 203*b* and the variable resistance layers 204 by using anisotropic etching method, it is preferable to use a thickness of protective layer 208 which prevents significant removal of variable resistance layers 204 disposed at the lower portion of the laminated body 203.

After that, as shown in FIG. 16C, the protective layers 208 and variable resistance layers 204 disposed at the bottom of multiples holes 203*b* can be removed by using an anisotropic etching method, which exposes the multiple contact plugs 105*a*.

It should be noted that when removing the protective layers 208 and the variable resistance layers 204 at the bottom of the holes 203*b*, the protective layers 208 and the variable resistance layers 204 disposed on the upper face of laminated body 203 are also removed.

An anisotropic etching method can be used, for example, such as reactive ion etching method or the like.

Here, as shown in FIG. 16C, by using the anisotropic etching method, when removing the protective layers 208 and the variable resistance layers 204 from the bottom of holes 203*b*, some portion of the protective layer 208 disposed at the lower portion of laminated body 203 may be removed but the variable resistance layer 204 is not removed.

Therefore, since the thickness of the variable resistance layer 204 is about the same in the upper portion as in the lower portion of the laminated body 203, the variation that occurs in the memory properties due to variations in thickness of the variable resistance layer 204 can be suppressed.

Subsequently, as illustrated in FIG. 15, the electrodes 206 are formed inside the holes 203*b*. This means the multiple electrodes 206 are disposed inside the variable resistance layers 204 and are connected to the contact plugs 105*a* of the peripheral circuit region 100.

At this time, the multiple electrodes 206 are respectively connected to the contact plugs 105*a*.

In addition, as the protective layers 208 are formed between the electrodes 206 and the variable resistance layers 204, the electrodes 206 which incorporate the protective layers 208 will be formed.

In this case, as the protective layers 208 are formed with electrically conductive materials, so the functions of the electrodes 206 can still be fulfilled.

In addition, if the protective layers 208 are formed with the same materials as the electrodes 206, the protective layers 208 will, in effect, be integrated to the electrodes 206.

Third Embodiment

In a non-volatile storage device 300, the memory region 200 includes memory cells which store data, the peripheral circuit region 100 includes peripheral circuits that drives the memory cells of the memory region 200, the contact region includes a contact electrode to connect the electrode layers 202 to an upper layer wiring, the upper layer wiring and the like required to form the device are included. The fabrication process for the peripheral circuit region 100, the contact region, and the upper layer wiring and the like, incorporates well-know technologies. Therefore, the following describes fabrication of the memory region 200.

Figure 17A:
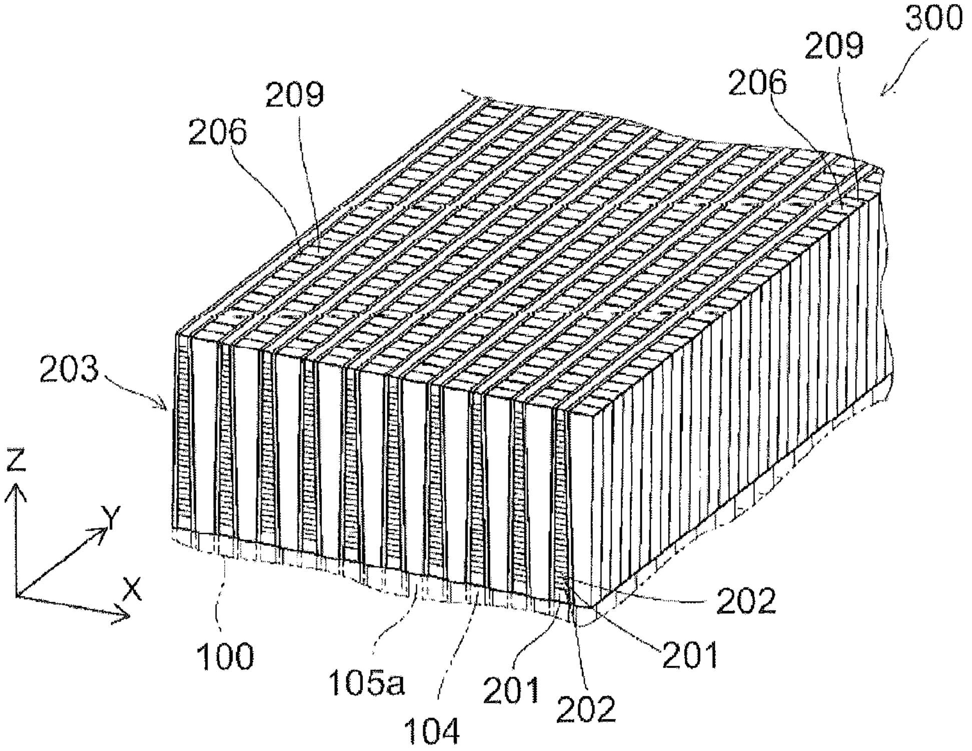
FIG. 17A is a schematic cross-sectional view illustrating a memory region including memory cells of the vertical gate type.
Figure 17B:
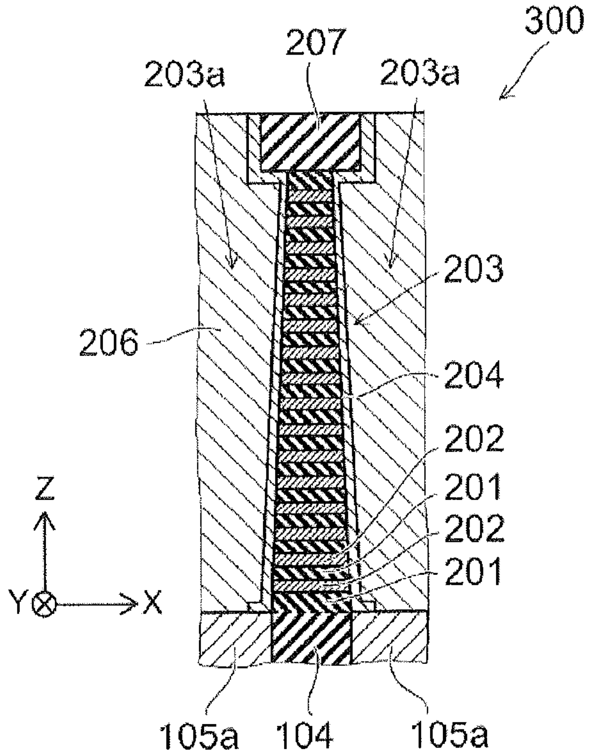
FIG. 17B is an enlarged schematic cross-sectional view illustrating the memory region depicted in FIG. 17A.
Figure 17C:
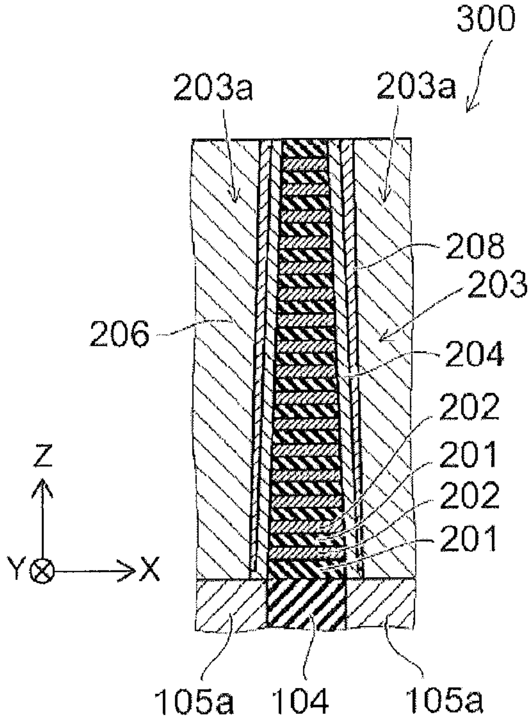
FIG. 17C is an enlarged schematic cross-sectional view illustrating the memory region depicted in FIG. 17A according to certain embodiments.

FIGS. 17A to 17C are schematic cross-sectional views illustrating the memory region 200 included in the non-volatile storage device 300.

It should be noted that FIG. 17A is a schematic cross-sectional view illustrating a memory region 200 that has the memory cells of the vertical gate type, FIG. 17B is an enlarged schematic cross-sectional view illustrating the memory region 200 and FIG. 17C is an enlarged schematic cross-sectional view illustrating the memory region 200 according to additional embodiments.

As shown in FIG. 17A and FIG. 17B, in the memory region 200 included in the non-volatile storage device 300, the laminated bodies 203, and the variable resistance layers 204, the electrodes 206 and the masking layer 207 are arranged.

In the laminated bodies 203, insulating layers 201 and electrode layers 202 are alternately laminated.

Masking layer 207 is provided on top of the laminated bodies 203. Masking layer 207 can be formed, for example, with amorphous silicon or the like. However, the masking layer 207 is not necessarily required to protect the variable resistance layer 204 where a protective layer 208 is used.

The laminated bodies 203 and the masks formed by the patterned masking layer 207 are divided by multiple grooves 203*a* which extend in the Z direction and the Y direction. The grooves 203*a* extend in the Z direction to reach the upper face of the contact plugs 105*a* of the peripheral circuit region 100.

The dimensions in the X direction of the grooves 203*a* taper from a large dimension at the upper portion of the laminated bodies 203 to a smaller dimension at the lower portion of the laminated bodies 203. Therefore, the laminated bodies 203 are formed with a taper (sidewall are not perfectly vertical) between each groove 203*a*.

The dimensions in the X direction of the masks 207 that are divided by the grooves 203*a* are greater than the dimensions in X direction of the laminated bodies 203 which are divided by the grooves 203*a*. (The masks 207 extend past the upper portions of laminated bodies into the grooves 203*a*.)

The insulating layers 201 provided by the laminated bodies 203 are formed by using, for example, silicon oxide and the like. The thickness of the insulating layers 201 can be, for example, about 30 nm.

The electrode layers 202 that are provided by the laminated bodies 203 are formed by using, for example, titanium nitride and the like. The thickness of the electrode layers 202 can be, for example, about 40 nm.

The variable resistance layer 204 is disposed on the inner walls of the grooves 203*a*. The variable resistance layers 204 are provided between the electrode layers 202 and the electrodes 206. The variable resistance layer 204 is formed of, for example, metal oxide. The thickness of the variable resistance layer 204 can be, for example, about 5 nm.

As shown in FIG. 17B, the variable resistance layer 204 extend along a portion of the bottom of the grooves 203*a*. It should be noted that, the variable resistance layers 204 can also be located at the upper end of the laminated bodies 203 and in the direction of the interior of the electrodes 206.

The electrodes 206 extend through the interior of the grooves 203*a* in the Z direction. The multiple electrodes 206 are respectively connected to the multiple contact plugs 105*a* disposed in the peripheral circuit region 100. That is, the multiple electrodes 206 go through the laminated bodies 203 in the Z direction and are connected to the contact plugs 105*a* of the peripheral circuit region 100.

The electrodes 206 can be formed, for example, from polysilicon or tungsten. If the electrodes 206 are made of polysilicon, the manufacturability can be improved. If the electrodes 206 are made of tungsten, the electrical resistance can be reduced.

In addition, as shown in FIG. 17C, protective layers 208 which are formed by the electrically conductive materials between the electrodes 206 and the variable resistance layers 204 can be provided. In this case, the protective layers 208 can be formed with the same materials as those of the electrodes 206.

Even in this case, the variable resistance layers 204 can also extend over the lower end of the laminated bodies 203 and in the direction of the interior of the electrodes 206.

Fourth Embodiment

In a non-volatile storage device 300*a*, a memory region 200*a* includes memory cells which store data, a peripheral circuit region 100 including peripheral circuits that drives the memory cells of the memory region 200*a*, a contact region including contact electrodes to connect the electrode layers 202 to an upper layer wiring, the upper layer wiring and the like is provided but fabrication of the peripheral circuit region 100, the contact region, and the upper layer wiring and the like, requires only well-known technologies. Therefore, the following describes the memory region 200*a*.

FIG. 18 is a schematic view illustrating the memory region 200*a* included in the non-volatile storage device 300*a*.

Figure 18A:
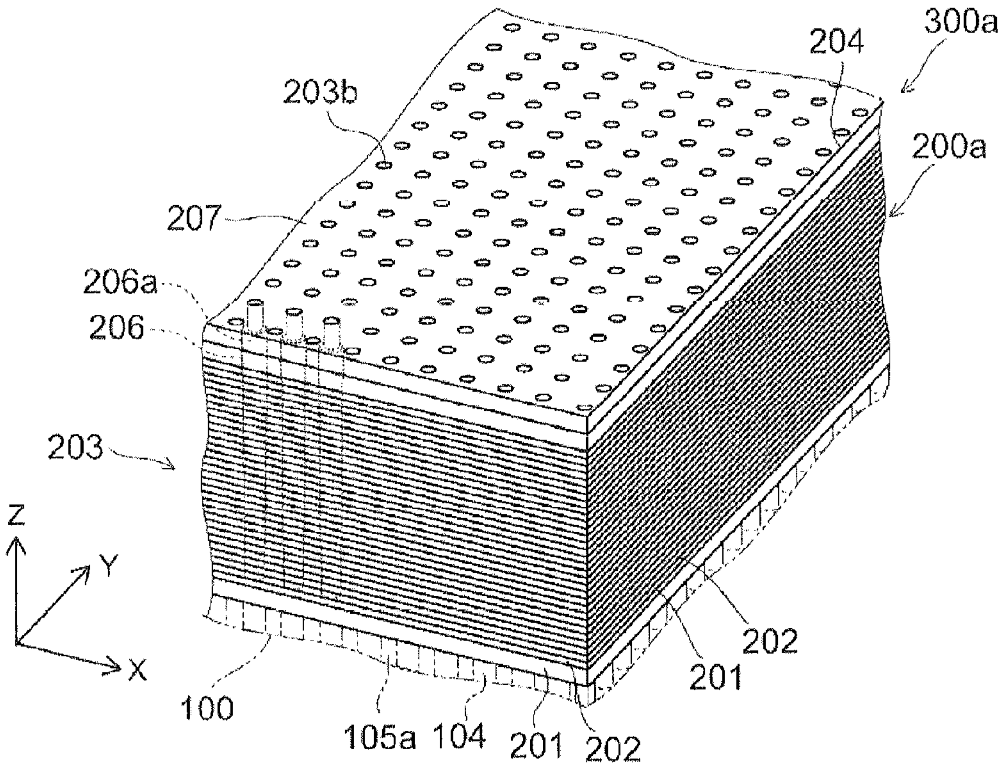
FIG. 18A is a schematic view illustrating a memory region including memory cells of the vertical channel type.
Figure 18B:
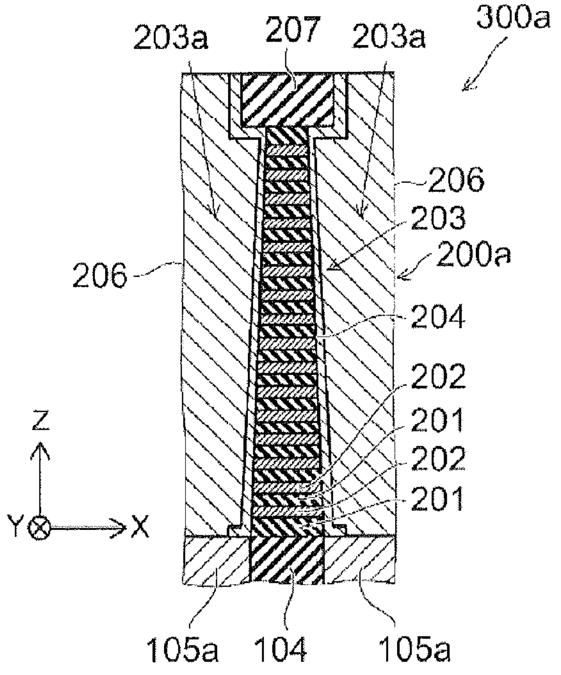
FIG. 18B is an enlarged schematic cross-sectional view illustrating the memory region depicted in FIG. 18A.
Figure 18C:
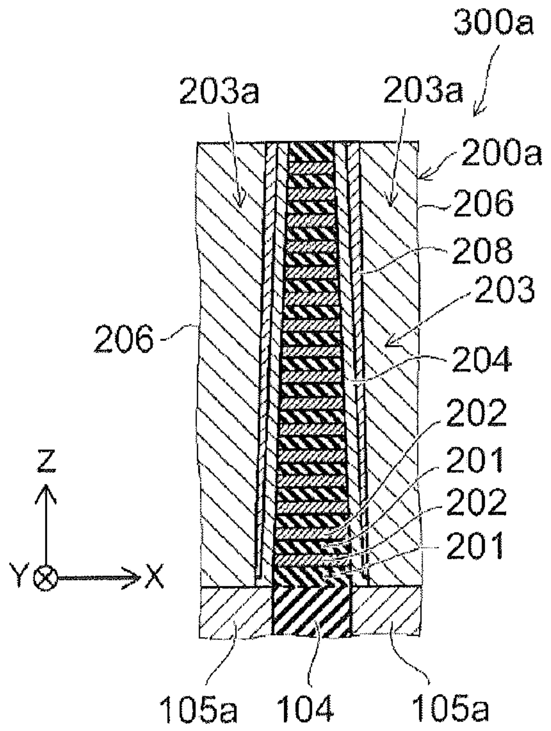
FIG. 18C is an enlarged schematic cross-sectional view illustrating the memory region depicted in FIG. 18A according to certain embodiments.

It should be noted that FIG. 18A is a schematic view illustrating the memory region 200*a* that has the memory cells of the vertical channel type, FIG. 18E is an enlarged schematic cross-sectional view illustrating the memory region 200*a*, and FIG. 18C is an enlarged schematic cross-sectional view illustrating the memory region 200*a* according to additional embodiments.

As shown in FIG. 18A and FIG. 18B, in the memory region 200*a* included in non-volatile storage device 300*a*, laminated bodies 203, variable resistance layers 204, electrodes 206 and masks 207 are arranged.

Laminated bodies 203 and masks 207 are formed as explained in relation to FIG. 17A and FIG. 17B. In the masks 207 and the laminated bodies 203, multiple holes 203*b* that extend in Z direction are provided.

The cross-sectional dimensions of the holes 203*b* are tapered from the upper portion to the lower portion of the laminated bodies 203. Therefore, the faces of the laminated bodies 203 exposed inside the holes 203*b* are inclined to less than vertical. The holes 203*b* extend to reach the upper face of the contact plugs 105*a* of the peripheral circuit region 100. The cross-sectional dimensions of the holes 203*b* through the masks 207 are reduced as compared to the cross-sectional dimensions of the holes 203*b* in the upper portion of the laminated bodies 203.

The variable resistance layer 204 is disposed to cover the inner walls of the holes 203*b*. The variable resistance layer 204 is provided between the electrode layers 202 and the electrodes 206. The variable resistance layer 204 is formed of, for example, metal oxide. The thickness of the variable resistance layers 204 can be, for example, about 5 nm.

As shown in FIG. 18B, the variable resistance layers 204 extend on the lower end of the laminated bodies 203 in the direction of the interior of the electrodes 206. That is, the variable resistance layers 204 extend along some portion of bottom of holes 203*a*. It should be noted that the variable resistance layers 204 can also be projected at the upper end of the laminated bodies 203 and in the direction of the interior of the electrodes 206.

The electrodes 206 extend through the interior of the holes 203*b* in the Z direction. The multiple electrodes 206 are respectively connected to the multiple contact plugs 105*a* in the peripheral circuit region 100. That is, the multiple electrodes 206 go through the laminated bodies 203 in the Z direction and are connected to the contact plugs 105*a* of the peripheral circuit region 100.

The electrodes 206 can be formed, for example, from polysilicon or tungsten. If the electrodes 206 are made of polysilicon, the manufacturability can be improved. If the electrodes 206 are made of tungsten, the electrical resistance can be reduced.

In addition, as shown in FIG. 18C, the protective layers 208 which are formed by the electrically conductive materials between the electrodes 206 and the variable resistance layers 204 can be provided. In this case, the protective layers 208 can be formed with the same materials as those of the electrodes 206.

Even in this case, the variable resistance layers 204 can also be projected at the lower end of the laminated bodies 203 and in the direction of the interior of the electrodes 206.

It should be noted that in the embodiments that have been previously illustrated, if the laminated bodies 203 having the tapers on them are formed, that means the dimensions in X direction of the grooves 203*a* reduce as with depth into the laminated body 203, but the disclosure is not limited to this structural characteristic. In this disclosure, if the laminated bodies 203 having the above-mentioned reverse tapers are formed, that means the dimensions in X direction of the grooves 203*a* can also be applied even in the cases where the bottom portions of the grooves 203*a* become wider relative to the upper portions of the grooves 203*a*.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A memory cell array, comprising:

at least one memory stack having alternating layers of insulator and electrode materials formed over a peripheral circuit region on a substrate;

a plurality of layered bodies comprising alternating layers of an electrode material and an insulating material extending from an insulating region overlying a surface of the peripheral circuit region and located adjacent to, and offset from, the location of a contact plug to either side thereof, and apertures having side walls defining walls of the layered bodies, the apertures extending between each adjacent layered body and having a variable width along a depth direction thereof;

a uniform thickness variable resistance layer formed over the side walls of the layered bodies along a depth of the apertures.

2. The memory cell array of claim 1, further including:

an extending portion of the variable resistance layer extending from a base of the layered bodies inwardly of a base of the aperture; and a gap extending between adjacent extending portions of the variable resistance layer, wherein the gap overlays an exposed contact plug.

3. The memory cell of claim 1, further including a protective layer overlying the variable resistance layer; the protective layer having a variable thickness along the depth direction of the aperture;

a gap across a base of the aperture, wherein the surface of a contact plug is exposed; and a conductive material filling the aperture and overlying and contacting the protective layer and an exposed surface of a contact plug.

4. The memory cell array of claim 3, wherein the protective layer and the conductive material are the same material.

5. A method of forming a memory cell array, comprising:

forming a peripheral circuit region having at least one contact plug therein on a substrate;

forming an insulating film over the peripheral circuit region;

depositing a laminated film having a plurality of insulating layers and a plurality of electrode layers formed between the insulating layers to form a plurality of layered bodies;

depositing a masking layer over the laminated film;

pattern etching the laminated film to form a plurality of apertures extending from the masking layer and through the laminated film and terminating on the insulating film overlying the peripheral circuit region, each of the apertures having a width immediately adjacent to the masking layer that is greater than a width of the aperture immediately adjacent to the insulating film overlying the peripheral circuit region, each aperture defining sidewalls of individual layered bodies of insulating layers and electrode layers between adjacent apertures, and leaving a portion of the masking layer overlying an upper surface of the individual bodies;

depositing a variable resistance layer over the sidewalls of the individual layered bodies and the insulating film overlying the peripheral circuit region; and etching an aperture through the insulating film at a base of the aperture while simultaneously protecting the variable resistance layer disposed on the sidewalls of the individual layered bodies from etching thereof.

6. The method of claim 5, wherein protecting the variable resistance layer on the sidewalls of the individual layered bodies includes:

changing a size of the masking layer in relation to a size of the individual layered bodies to cause the masking layer to overlie over a portion of the aperture sufficient to shade the sidewalls of the individual layered bodies from directional etching employed to etch the insulating film at the base of the apertures.

7. The method of claim 6, wherein changing the size of the masking layer in relation to the size of the individual layered bodies includes increasing a size of the masking layer.

8. The method of claim 6, wherein changing the size of the masking layer in relation to the size of the individual layered bodies includes increasing the width of the aperture by removing a portion of the individual layered bodies along the sidewalls of the aperture.

9. The method of claim 6, further including:

depositing a conductive material in the apertures in contact with and overlying the variable resistance layer and an exposed portion of a contact plug.

10. The method of claim 9, further including:

removing portions of the conductive material in the apertures to form individual electrically isolated pillars of conductive material overlying and in electrical contact with individual conductive plugs at the base of the apertures; and filling spaces between the individual pillars of conductive material with an insulative material.

11. The method of claim 5, wherein protecting the variable resistance layer on the sidewalls of the individual layered bodies includes forming a conductive film layer over the variable resistance layer prior to etching of the insulating film from the base of the aperture.

12. The method of claim 11, further including depositing a conductive material in the apertures.

* * * * *